US007863061B2

United States Patent
Ikuta et al.

(10) Patent No.: US 7,863,061 B2
(45) Date of Patent: Jan. 4, 2011

(54) SURFACE EMITTING LASER MANUFACTURING METHOD, SURFACE EMITTING LASER ARRAY MANUFACTURING METHOD, SURFACE EMITTING LASER, SURFACE EMITTING LASER ARRAY, AND OPTICAL APPARATUS INCLUDING SURFACE EMITTING LASER ARRAY

(75) Inventors: Mitsuhiro Ikuta, Kawasaki (JP); Yasuhisa Inao, Tokyo (JP); Takako Yamaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/509,635

(22) Filed: Jul. 27, 2009

(65) Prior Publication Data

US 2010/0029027 A1 Feb. 4, 2010

(30) Foreign Application Priority Data

Jul. 31, 2008 (JP) .............................. 2008-198951

(51) Int. Cl.
*H01L 21/00* (2006.01)

(52) U.S. Cl. ..................... 438/21; 438/29; 257/E21.002

(58) Field of Classification Search ................... 438/21, 438/29, 34, 39; 257/E21.002
See application file for complete search history.

(56) References Cited

U.S. PATENT DOCUMENTS

| | | | |
|---|---|---|---|
| 5,258,316 A * | 11/1993 | Ackley et al. | 438/42 |
| 5,818,066 A * | 10/1998 | Duboz | 257/21 |
| 6,320,893 B1 * | 11/2001 | Ueki | 372/96 |
| 6,746,948 B2 * | 6/2004 | Ueda et al. | 438/604 |
| 7,033,853 B2 * | 4/2006 | Supper | 438/39 |

(Continued)

FOREIGN PATENT DOCUMENTS

JP 2001-284722 A 10/2001

(Continued)

OTHER PUBLICATIONS

H.J. Unold et al., "Large-Area Single-Mode VCSELs and the Self-Aligned Surface Relief," IEEE Journal on Selected Topics in Quantum Electronics, vol. 7, No. 2, Mar./Apr. 2001.

(Continued)

*Primary Examiner*—Walter L Lindsay, Jr.
(74) *Attorney, Agent, or Firm*—Fitzpatrick, Cella, Harper & Scinto

(57) ABSTRACT

Provided is a surface emitting laser manufacturing method, etc., which reduces process damage occurring to a surface relief structure, enabling stable provision of a single transverse mode characteristic. Provided is a method including a surface relief structure for controlling a reflectance in a light emitting portion of an upper mirror, the surface relief structure including a stepped structure, includes: forming a resist pattern including a pattern for forming a mesa structure and a pattern for forming a stepped structure, on or above the upper mirror, and performing first-phase etching for etching the surface layer of the upper mirror to determine the horizontal position of the stepped structure; forming a current confining structure after the performing first-phase etching; and performing second-phase etching for further etching the area that the first-phase etching has been performed, to determine the depth position of the stepped structure, after the forming a current confining structure.

15 Claims, 15 Drawing Sheets

U.S. PATENT DOCUMENTS

| | | | |
|---|---|---|---|
| 7,145,183 B2 * | 12/2006 | Supper | 257/98 |
| 7,170,108 B2 * | 1/2007 | Ueda et al. | 257/184 |
| 7,408,967 B2 * | 8/2008 | Collins et al. | 372/46.01 |
| 7,499,481 B2 * | 3/2009 | Ikuta | 372/50.124 |
| 7,535,946 B2 | 5/2009 | Nagatomo et al. | 372/50.124 |
| 7,675,956 B2 * | 3/2010 | Maeda et al. | 372/50.124 |
| 2003/0052326 A1 * | 3/2003 | Ueda et al. | 257/101 |
| 2004/0114653 A1 * | 6/2004 | Omori | 372/46 |
| 2004/0191938 A1 * | 9/2004 | Ueda et al. | 438/21 |
| 2005/0214961 A1 * | 9/2005 | Supper | 438/21 |
| 2005/0265415 A1 | 12/2005 | Lambkin | 372/43.01 |
| 2005/0286597 A1 * | 12/2005 | Mukoyama et al. | 372/50.23 |
| 2007/0014324 A1 * | 1/2007 | Maeda et al. | 372/46.01 |
| 2007/0121695 A1 * | 5/2007 | Miyamoto | 372/50.124 |
| 2008/0107145 A1 | 5/2008 | Hori et al. | 372/99 |
| 2008/0240190 A1 * | 10/2008 | Kuramoto et al. | 372/44.01 |
| 2008/0240194 A1 * | 10/2008 | Maeda et al. | 372/50.1 |
| 2008/0304535 A1 * | 12/2008 | Parriaux et al. | 372/99 |
| 2009/0034572 A1 | 2/2009 | Ikuta | 372/46.013 |
| 2009/0035884 A1 * | 2/2009 | Ikuta | 438/29 |
| 2009/0086786 A1 | 4/2009 | Ikuta | 372/50.12 |
| 2009/0232179 A1 | 9/2009 | Ikuta | 372/50.124 |
| 2009/0262775 A1 | 10/2009 | Uchida et al. | 372/50.124 |
| 2010/0029027 A1 * | 2/2010 | Ikuta et al. | 438/29 |
| 2010/0029030 A1 * | 2/2010 | Uchida et al. | 438/34 |

FOREIGN PATENT DOCUMENTS

| | | |
|---|---|---|
| JP | 2005-072623 A | 3/2005 |
| JP | 2005-191285 A | 7/2005 |
| WO | WO 2006/131316 A1 | 12/2006 |

OTHER PUBLICATIONS

H.J. Unold et al., "Increased-area oxidised single-fundamental mode VCSEL with self-aligned shallow etched surface relief," Electronics Letters, vol. 35, No. 16, Aug. 5, 1999.

J.A. Vukusic et al., "Numerical Optimization of the Single Fundamental Mode Output from a Surface Modified Vertical-Cavity Surface-Emitting Laser," IEEE Journal of Quantum Electronics, vol. 37, No. 1, Jan. 2001, pp. 108-117.

L.M.A. Plouzennec et al., "Gaussian Beam Profile and Single Transverse Mode Emission from Previously Multi-Mode Gain Guided VCSELs using Novel Etch," Proceedings of SPIE, vol. 3946, 2000, pp. 219-229.

* cited by examiner

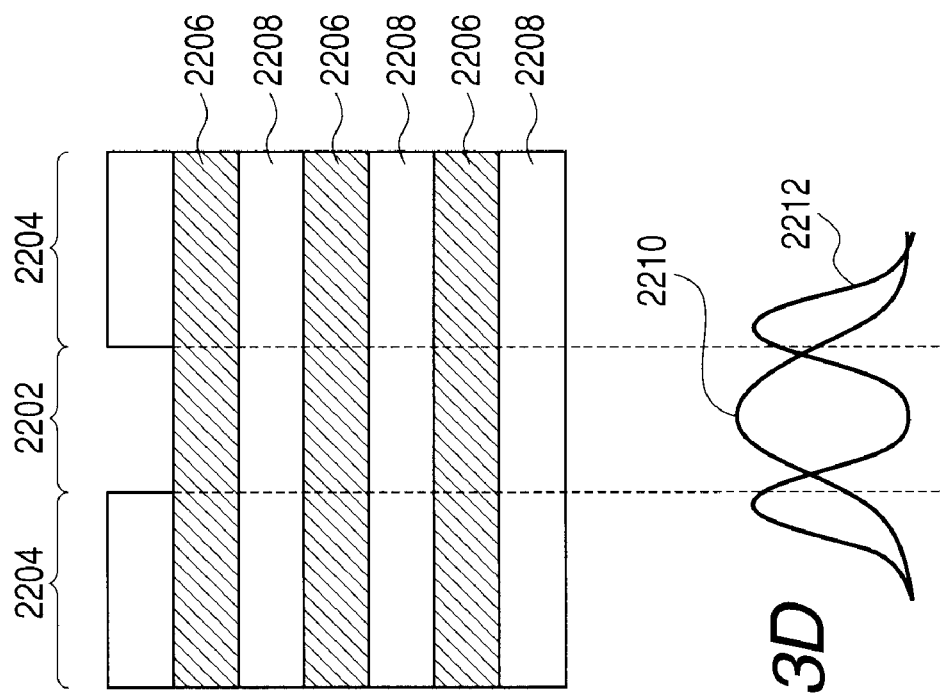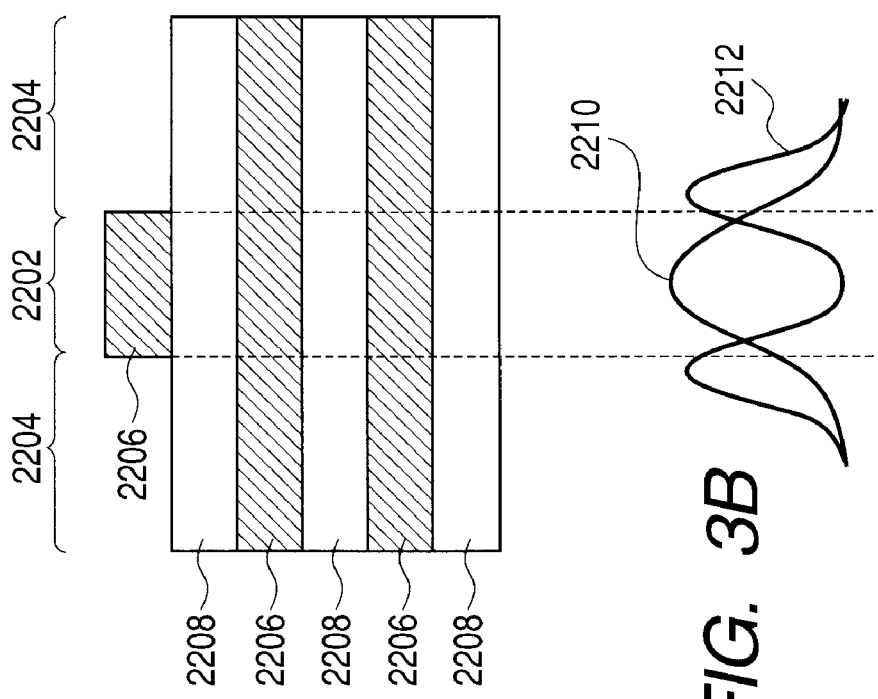

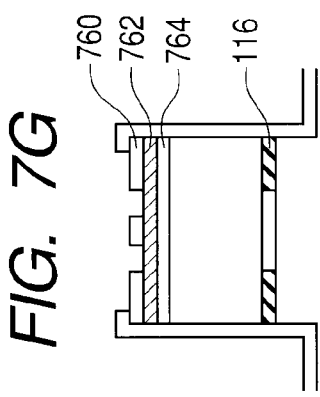
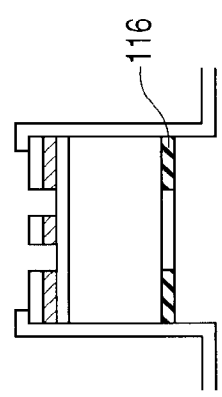
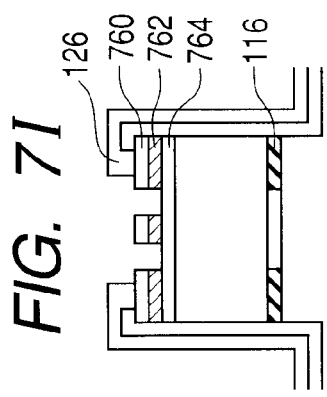
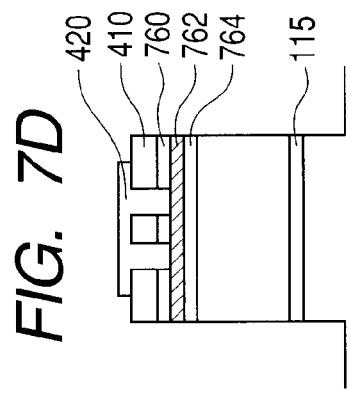
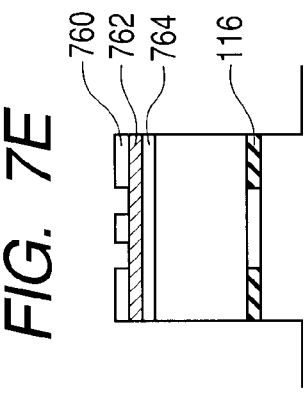
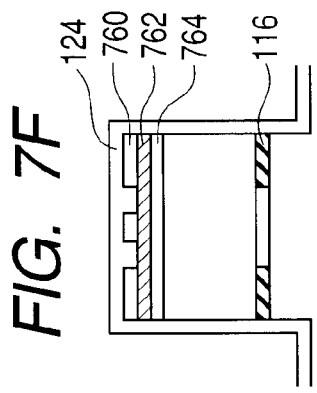
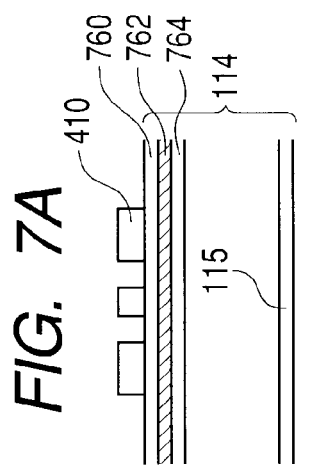
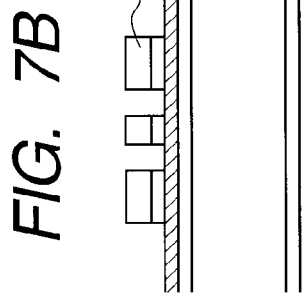
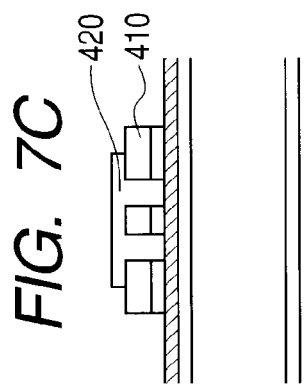

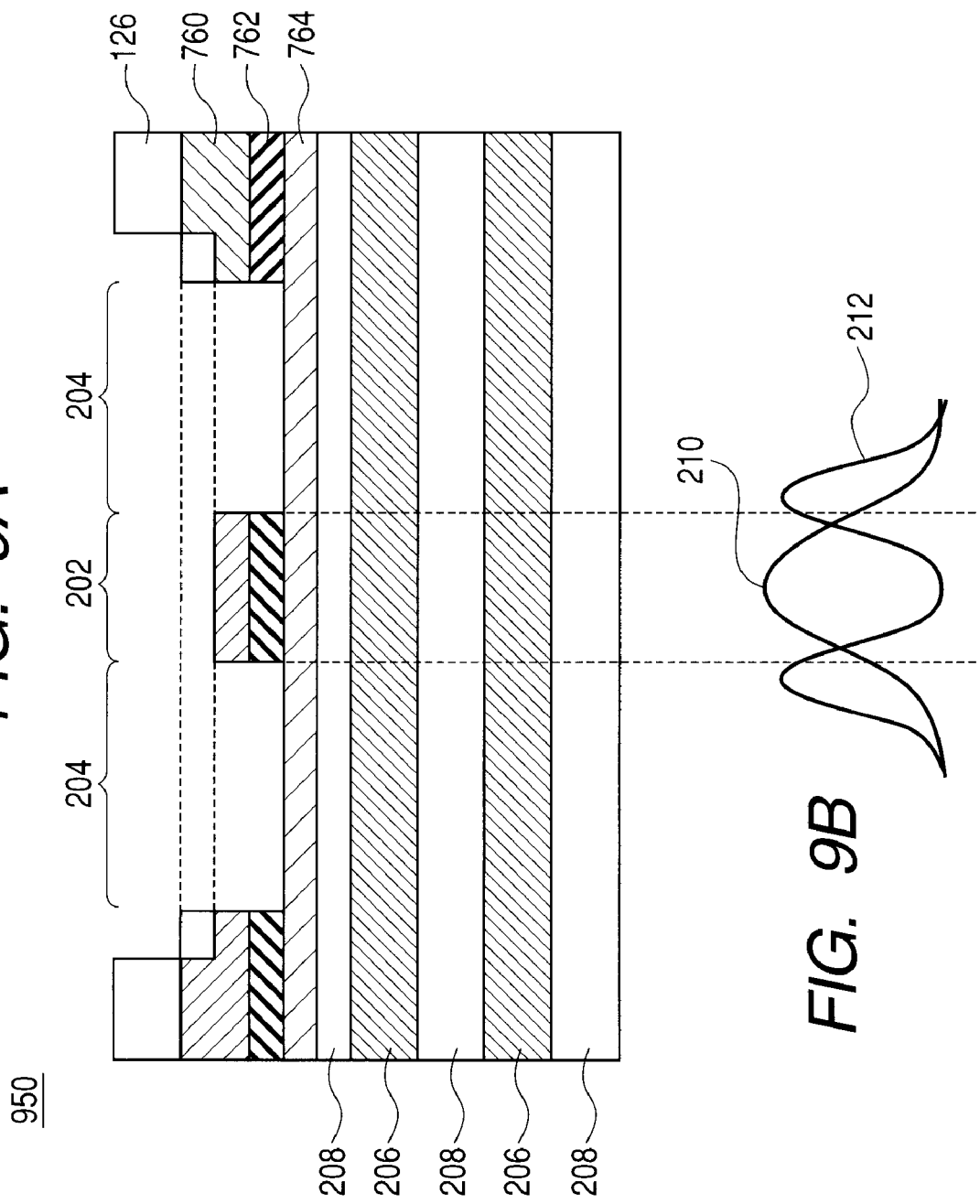

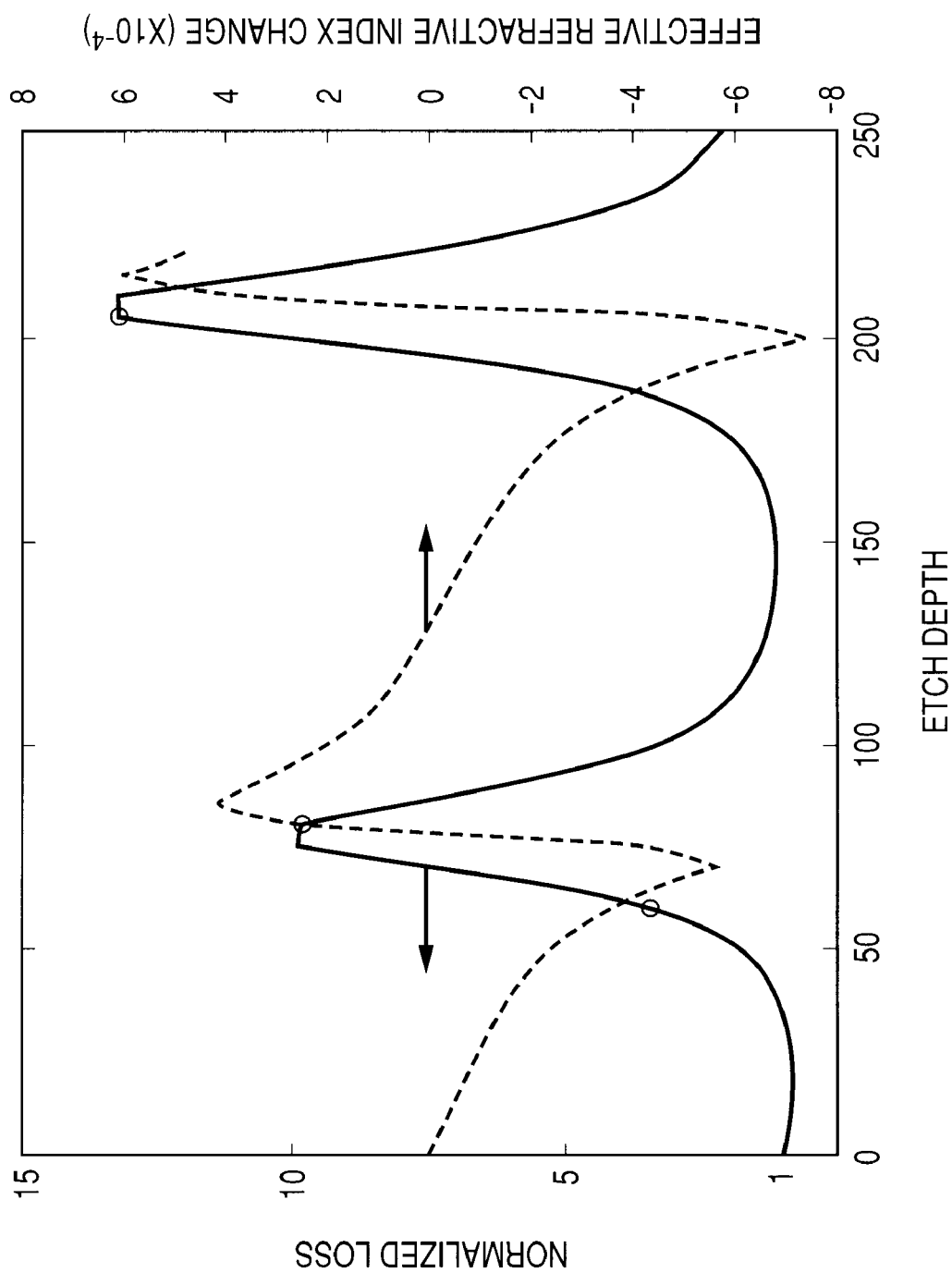

SURFACE EMITTING LASER MANUFACTURING METHOD, SURFACE EMITTING LASER ARRAY MANUFACTURING METHOD, SURFACE EMITTING LASER, SURFACE EMITTING LASER ARRAY, AND OPTICAL APPARATUS INCLUDING SURFACE EMITTING LASER ARRAY

BACKGROUND OF THE INVENTION

1. Field of the Invention

The present invention relates to a surface emitting laser manufacturing method, a surface emitting laser array manufacturing method, a surface emitting laser, a surface emitting laser array, and an optical apparatus including a surface emitting laser array.

2. Description of the Related Art

A vertical cavity surface emitting laser (hereinafter referred to as "VCSEL"), which is one of the surface emitting lasers, enables light to be extracted in a direction perpendicular to the substrate surface, and thus, a two-dimensional array can easily be formed merely by changing a mask pattern for element formation. Parallel processing using a plurality of beams emitted from this two-dimensional array enables an increase in density and speed, and thus, application of such two-dimensional array in various industries, e.g., optical communication, has been expected. For example, use of a surface emitting laser array as an exposure light source for an electrophotographic printer enables the printing density and speed to be increased by means of a plurality of beams.

Such electrophotographic printing requires formation of stable and minute laser spots on a photosensitive drum, and thus, stable operation in a single transverse mode and/or a single longitudinal mode is required as a laser characteristic.

In recent years, for surface emitting lasers, the method of forming a current confining structure using a selective oxidization technique to inject current only to a necessary region has been developed.

In this method, for higher performance, an AlGaAs layer with a high Al proportion, for example, an Al proportion of 98%, is provided in a multilayer reflecting mirror and selectively oxidized in a high-temperature water vapor atmosphere to form a current confining structure so that current is injected only to a necessary region.

FIG. 2 illustrates a cross-sectional diagram illustrating a surface emitting laser according to a related art example in which a current confining structure is formed using the above-described selective oxidation technique.

In a surface emitting laser 200 in FIG. 2, a vertical cavity structure is formed on a substrate 2104.

In the vertical cavity structure, an active layer 2110 that emits light upon current being injected thereto, and a lower spacer layer 2108 and an upper spacer layer 2112, which are provided to adjust the cavity length, are interposed between a lower mirror 2106 and an upper mirror 2114.

Here, each of the mirrors is configured as a multilayer reflecting mirror. In the vertical cavity structure, at least a portion of the upper mirror 2114 is etched to form a mesa structure.

In a high Al proportion layer 2115 in the upper mirror 2114, a current confining structure 2116 is formed by selective oxidation performed from the side wall of the mesa structure.

Also, the surfaces of the mesa structure are partially electrically passivated by an insulating film 2124.

A predetermined potential difference is provided between a lower electrode 2102 that is in contact with the rear surface of the substrate 2104 and an upper electrode 2126 that is in contact with an upper portion of the mesa structure. Consequently, the active layer 2110 emits light upon current being injected thereto, the light is subjected to laser oscillation by the cavity, and then, laser light is emitted from a light exit region 2140 in an aperture of the upper electrode 2126.

However, this selective oxidation is undesirable from the viewpoint of single transverse mode.

In other words, an excessively-large refractive index difference occurs because of the existence of the oxidized layer, resulting in generation of high-order transverse mode components.

Therefore, as a countermeasure for that, the method of, e.g., providing single transverse mode lasing by reducing the light emitting region to around a diameter of 3 µm by means of the current confining structure to prevent the high-order transverse mode components from being confined has been employed.

However, in such method of constraining the light emitting region, the output per element is substantially lowered because of the size reduction of the light emitting region.

In view of such circumstances as described above, conventionally, the method of enabling single transverse mode lasing while a light emitting region with a certain largeness being kept has been studied, rather than the above-described method of providing a single transverse mode by means of the current confining structure alone by narrowing the light emitting region.

In other words, the method of intentionally introducing the loss difference between the fundamental transverse mode and a high-order transverse mode to enable single transverse mode lasing while a light emitting region with a certain largeness being kept have been studied.

As one example of such method, Japanese Patent Application Laid-Open No. 2001-284722, H. J. Unold et al. (Electronics Letters, Vol. 35, No. 16(1999)), and J. A. Vukusic et al. (IEEE JOURNAL OF QUANTUM ELECTRONICS, Vol. 37, No. 1, (2001) 108) discloses a method called "surface relief".

In this method, a stepped structure for controlling the reflectance is provided to a light exit surface of a surface emitting laser element (the light exit region 2140 in FIG. 2) to increase the loss of high-order transverse mode components over the loss of fundamental transverse mode components.

In this specification, hereinafter, a stepped structure provided in a light exit region of a light exit surface of a reflecting mirror for reflectance control as described above is referred to as "surface relief structure".

Next, a surface relief structure according to the aforementioned prior art examples will be described using FIGS. 3A to 3D. For a VCSEL mirror, in general, a multilayer reflecting mirror including a plurality of pairs of two layers having different refractive indexes alternately stacked, each layer having an optical thickness that is one fourth of the lasing wavelength (hereinafter, it may be abbreviated to "¼ wavelength" unless otherwise specified), is used. Normally, this multilayer reflecting mirror is terminated by a high refractive index layer, and thus has a high reflectance of no less than 99% using reflection by the low-refractive-index terminal interface with the air as well.

Here, first, a protruded surface relief structure illustrated in FIGS. 3A and 3B will be described. Unold et al. also discloses such a protruded surface relief structure.

Like a low reflection region 2204, which is illustrated in FIG. 3A, when the final layer of high refractive index layers 2206 (which has an optical thickness of the ¼ wavelength) is removed, the multilayer reflecting mirror is terminated by a low refractive index layer 2208. Consequently, a protruded surface relief structure can be obtained.

With such protruded surface relief structure, the phase of light reflected by the interface between the low refractive index layer 2208 and the air, which has a refractive index lower than that of the low refractive index layer 2208, is shifted by $\pi$ from the phase of light totally reflected by the multilayer reflecting mirror, which exists below the interface.

Accordingly, the reflectance of the low reflection region 2204 is lowered down to, e.g., no more than 99%, and the reflectance loss can be increased up to around five to ten-fold.

In order to provide a loss difference between the fundamental transverse mode and a high-order transverse mode using this principle, as illustrated in FIG. 3B, the low reflection region 2204 is formed only around the light emitting portion so that the low reflection region 2204 and a high-order transverse mode optical distribution 2212 largely overlap with each other.

Meanwhile, a high reflection region 2202 is left in the center part of the light emitting portion so that a fundamental transverse mode optical distribution 2210 and the high reflection region 2202 in which the final layer of the high refractive index layers 2206 is left largely overlap with each other.

Consequently, the reflection loss of high-order transverse mode components is increased to suppress high-order transverse mode lasing, enabling provision of the fundamental transverse mode lasing only.

Also, like the low reflection region 2204 illustrated in FIGS. 3C and 3D, a recessed surface relief structure can be provided by further adding a low refractive index layer (which may also be a high refractive index layer) with an optical thickness of the ¼ wavelength over the final layer of the high refractive index layers 2206 (or performing etching only for the high reflection region 2202 with the low reflection region 2204 remaining as it is).

A recessed surface relief structure such as described above is also disclosed in Japanese Patent Application Laid-Open No. 2001-284722. This structure also enables lowering the reflectance by the same principle as that of the protruded surface relief, enabling provision of single mode lasing in the fundamental transverse mode only.

When control is performed by providing a loss difference between optical modes of a VCSEL by means of a surface relief structure, the alignment in the horizontal direction of the surface relief structure and the current confining structure is important. In other words, when trying to provide lasing in the fundamental transverse mode only, if the current confining aperture center and the surface relief center are misaligned from each other, extra loss will be caused in the components of the lasing mode intended to be provided (for example, the fundamental transverse mode).

As a method for manufacturing a surface relief structure, for example, the method of processing the surface by means of, e.g., FIB (Focused Ion Beam) after completion of the element is disclosed in L. M. A Plouzennec et al. (Proceedings of SPIE Vol. 3946 (2000) 219).

However, it is difficult to align the relief position and the light emitting region (current injection region) at that stage.

In particular, in the case of manufacturing a VCSEL array device, the aforementioned process, in which the amount of the aforementioned misalignment may vary depending on the element, causes a decrease in the array device yield rate. As a relief alignment technique that solves that problem, Unold et al. discloses a method called a self-alignment process.

Hereinafter, the aforementioned self-alignment process in Unold et al. will further be described using FIGS. 4A to 4E.

As illustrated in FIG. 4A, a first resist 2410 is applied onto an upper mirror 2114 of a VCSEL wafer, and patterning for a surface relief structure and patterning for a mesa structure are simultaneously performed on the resist.

Here, a protruded pattern is illustrated as a surface relief.

Next, as illustrated in FIG. 4B, the semiconductor is dry-etched using the patterned resist 2410 as a mask.

As a result of this etching, a surface relief structure 2150 is formed.

Next, as illustrated in FIG. 4C, a second resist 2420 is applied and patterned so as to protect the surface relief structure 2150. Next, as illustrated in FIG. 4D, wet etching is performed so as to form a mesa structure, making a high Al proportion layer 2115 be exposed at the side wall of the mesa.

Next, as illustrated in FIG. 4E, the high Al proportion layer 2115 is selectively oxidized to form a current confining structure 2116.

Although Unold et al. does not disclose whether or not to remove the resists 2410 and 2420 before performing the selective oxidation, here, illustration is provided supposing that they are removed. Subsequently, according to Unold et al., formation of contacts in the device, passivation, and pad bonding are performed by means of standard processes.

In this process, the positioning patterning of the mesa structure and the surface relief structure is performed using one and the same mask.

Since the current confining structure reflects the mesa structure, this process enables highly-accurate horizontal alignment of the current confining structure and the surface relief structure.

SUMMARY OF THE INVENTION

The above-described manufacturing method according to Unold et al., which is a related art example, enables highly-accurate horizontal alignment of the current confining structure and the surface relief structure. However, for the surface relief structure, control of the etch depth of the relief is also important as well as the horizontal position control.

However, in the manufacturing method according to Unold et al., during the process of forming the current confining structure, the surface relief structure may be damaged as described below, which affects the etch depth, causing a problem in that a desired single transverse mode characteristic cannot be obtained.

In other words, due to the process after formation of the surface relief structure, the interface of the surface relief structure with the air, in particular, the bottom surface of the relief, may be damaged, which causes a problem in that a desired characteristic cannot be obtained.

Here, the process include, e.g., etching for mesa structure formation, resist ashing, current confining structure formation, selective oxidation, and electrode liftoff.

For example, when the second resist pattern 2420 is removed and the semiconductor layer is thereby exposed, the relief surface will be damaged due to arsenic atoms being extracted as a result of performing the selective oxidation.

Also, during the selective oxidation, even though the second resist pattern 2420 is not removed and the surface relief structure is protected by this protective layer, such resist-used protective layer according to Unold et al is not sufficient because the wafer is heated to a high temperature, and thus, the relief interface may get rough.

Furthermore, e.g., in the process of removing the protective film, the surface relief structure may come into contact with a protective film remover such as a buffered hydrofluoric acid, and be thereby damaged.

Accordingly, in the manufacturing method according to Unold et al., the aforementioned damage of the surface relief structure affects the etch depth, which may cause a problem in that a desired single transverse mode characteristic cannot be obtained.

Vukusic et al. discloses that the effect imposed on the optical mode varies depending on the etch depth of the relief as described above. FIG. 15 (corresponding to FIG. 10 in Vukusic et al.) illustrates such disclosure. More specifically, where the relief depth (etch depth) is displaced from that in the design, in a protruded surface relief, for example, sufficient loss cannot be caused in high-order mode components, which may cause multi-mode lasing.

Meanwhile, in a recessed surface relief, for example, the reflectance of fundamental mode components is lowered, which may result in even fundamental mode lasing not being provided.

As described above, in the manufacturing methods according to the related art examples, it is difficult to provide a relief depth (etch depth) as specified by the values in the design, which is a problem in manufacturing a surface emitting laser enabling stable provision of a single transverse mode characteristic.

In view of the aforementioned circumstances, an object of the present invention is to provide a surface emitting laser manufacturing method and a surface emitting laser, which reduces process damage occurring to the surface relief structure, enabling stable provision of a single transverse mode characteristic.

Another object of the present invention is to provide a method for manufacturing a surface emitting laser array of surface emitting lasers manufactured according to the surface emitting laser manufacturing method, a surface emitting laser array of the surface emitting lasers, and an optical apparatus including a surface emitting laser array of the surface emitting lasers.

In view of the above objects, the present invention provides a surface emitting laser manufacturing method for manufacturing a surface emitting laser including a lower mirror, an active layer and an upper mirror staked on a substrate, and a surface relief structure at a light emitting portion of the upper mirror, the method comprising: forming a resist pattern including a first pattern for forming a mesa structure and a second pattern for forming the surface relief structure, on or above the upper mirror; performing first-phase etching for etching a surface layer of the upper mirror using the resist pattern to determine a horizontal position of the surface relief structure; forming a current confining structure that constrains current injected to the active layer, after the performing the first-phase etching; and performing second-phase etching for further etching an area in which the first-phase etching has been performed, to determine a depth position of the surface relief structure, after the forming a current confining structure.

Also, the present invention provides a surface emitting laser comprising: a lower mirror, an active layer and an upper mirror stacked on a substrate; and a surface relief structure including a stepped structure provided at a light emitting portion of the upper mirror to control a reflectance, wherein the surface relief structure includes a third relief layer, a second relief layer and a first relief layer stacked in this order; wherein the stepped structure includes an etched region in which etching has been performed through the first relief layer and the second relief layer stacked on the third relief layer; wherein the first relief layer includes GaAs, and the second relief layer includes AlxGa1-xAs (x>0); and wherein the third relief layer includes AlyGa1-yAs (y<x) or AlGaInP.

The present invention can provide a surface emitting laser manufacturing method and a surface emitting laser that reduces process damage occurring to a surface relief structure, enabling stable provision of a single transverse mode characteristic.

Also, the present invention can provide a method for manufacturing a surface emitting laser array of surface emitting lasers manufactured according to the surface emitting laser manufacturing method, a surface emitting laser array of the surface emitting lasers, and an optical apparatus including a surface emitting laser array of the surface emitting lasers.

Further features of the present invention will become apparent from the following description of exemplary embodiments with reference to the attached drawings.

BRIEF DESCRIPTION OF THE DRAWINGS

FIGS. 3A, 3B, 3C and 3D are schematic diagrams illustrating a surface relief structure according to Unold et al. and Japanese Patent Application Laid-Open No. 2001-284722, which are related art examples: FIGS. 3A and 3B illustrate a protruded surface relief structure; and FIGS. 3C and 3D illustrate a recessed surface relief structure.

FIGS. 7A, 7B, 7C, 7D, 7E, 7F, 7G, 7H and 7I are diagrams illustrating a method for manufacturing a vertical cavity surface emitting laser according to embodiment 1 of the present invention.

FIGS. 9A and 9B are cross-sectional diagrams of a surface relief structure in a light exit region and in the vicinity of an upper electrode according to embodiment 3 of the present invention.

FIG. 15 is a diagram illustrating variation of an effect imposed on an optical mode depending on the etch depth of a relief according to Vukusic et al., which is a related art example.

DESCRIPTION OF THE EMBODIMENTS

According to the above-described configuration of the present invention, formation of a surface relief structure is performed by dividing the formation into two phases, and a process for performing the second-phase etching is performed after formation of a current confining structure, enabling reduction of process damage occurring to the surface relief structure.

In other words, in a process for performing the first-phase etching, which is performed before formation of a current confining structure, patterning to form a surface relief structure and patterning to form a mesa structure that is necessary for forming a current confining structure are simultaneously performed.

Consequently, horizontal alignment of the surface relief structure can stably be conducted.

Also, the process to performing the second-phase etching is performed after formation of the current confining structure, and the final relief depth is determined at that stage, enabling reduction of process damage occurring to the surface relief structure relative to that of the conventional processes.

Hereinafter, embodiments of the present invention will be described.

Embodiment 1

In embodiment 1, a vertical cavity surface emitting laser including a protruded surface relief structure and a manufacturing method thereof, etc., will be described.

Figure 1:
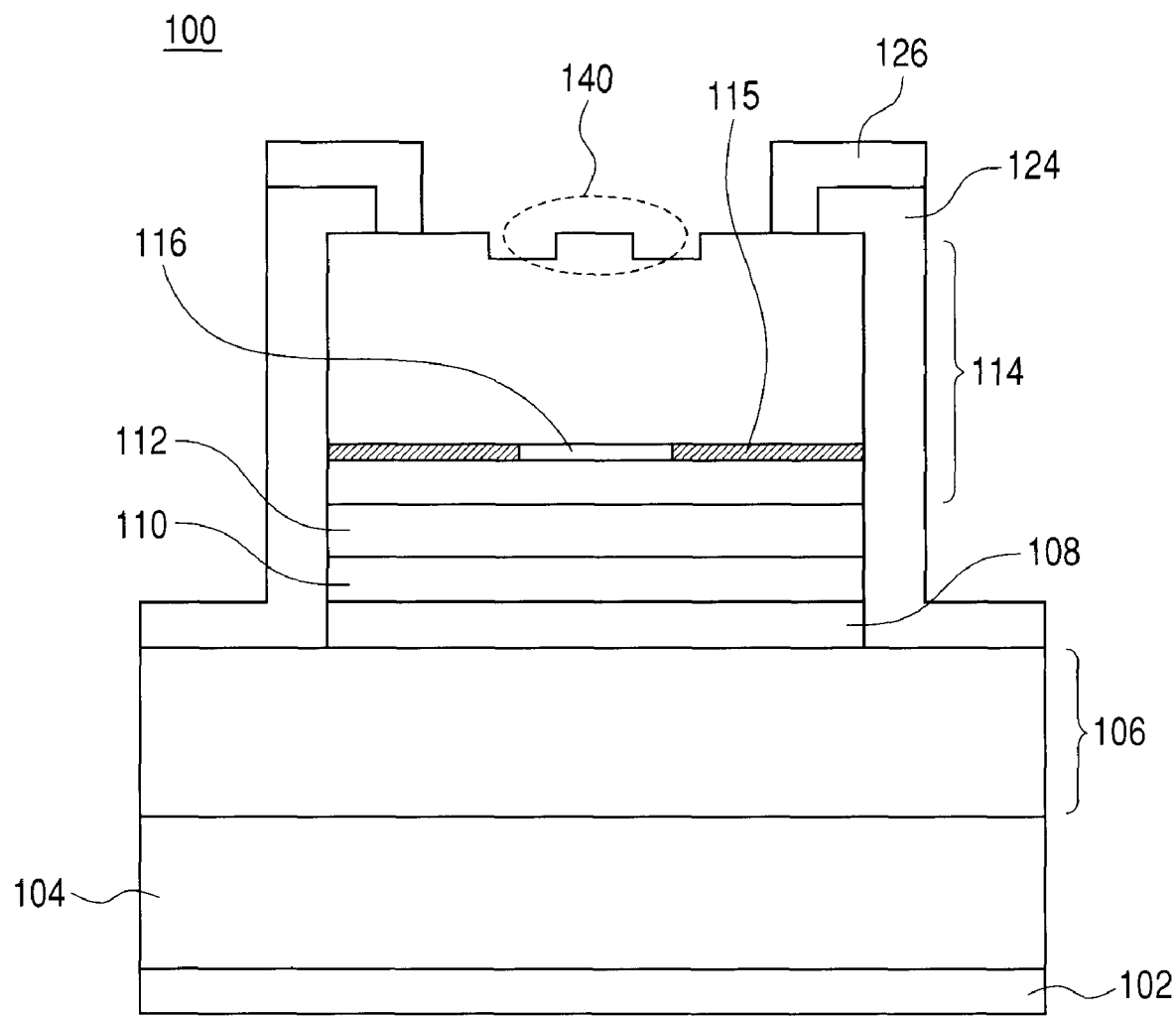
FIG. 1 is a cross-sectional diagram illustrating a vertical cavity surface emitting laser according to embodiments 1 and 2 of the present invention.
Figure 2:
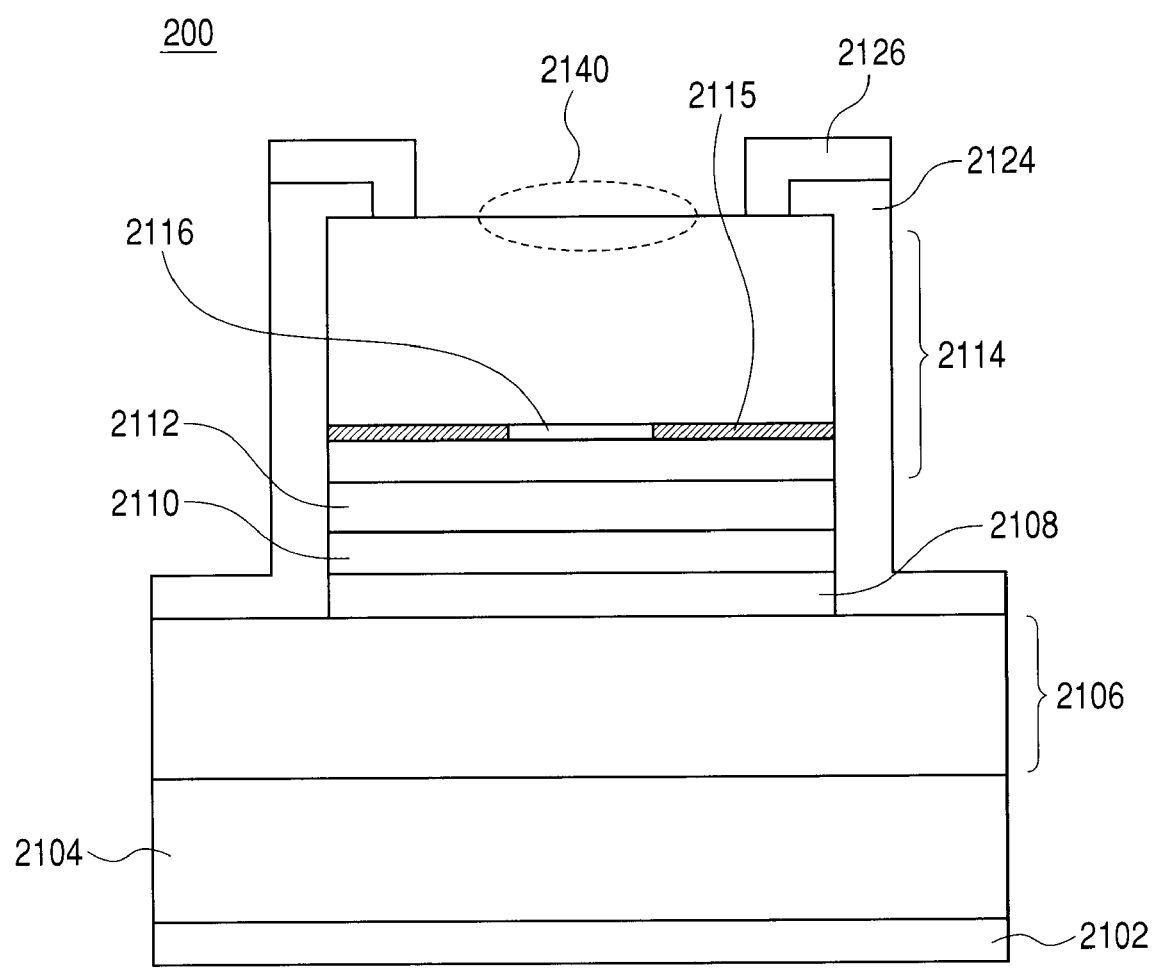
FIG. 2 is a cross-sectional diagram illustrating a surface emitting laser using a selective oxidation technique according to a related art example.
Figure 4A:
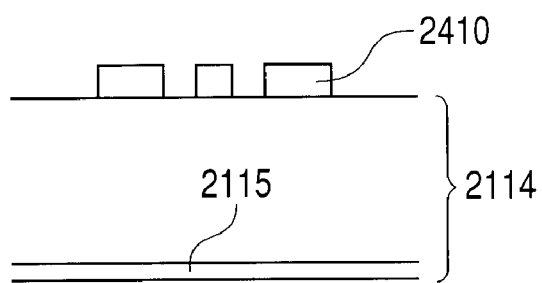
FIGS. 4A, 4B, 4C, 4D and 4E are schematic diagrams illustrating a self-alignment process according to Unold et al., which is a related art example.
Figure 4D:
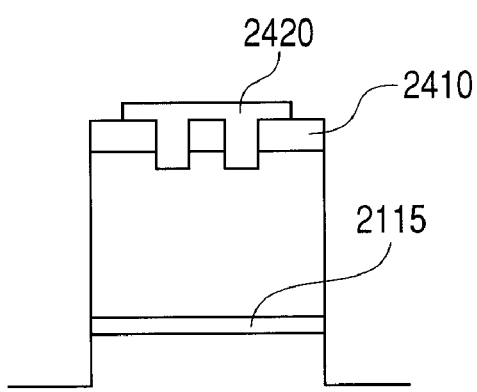
Figure 4B:
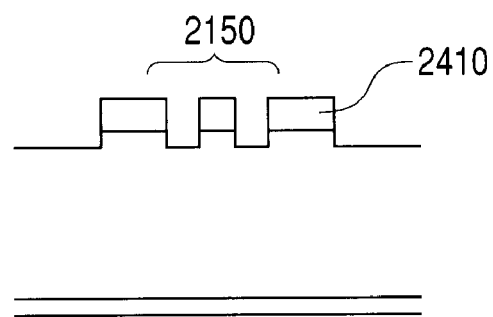
Figure 4E:
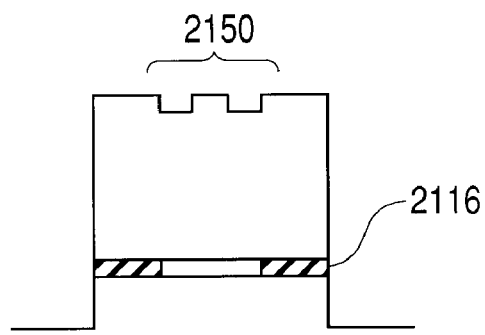
Figure 4C:
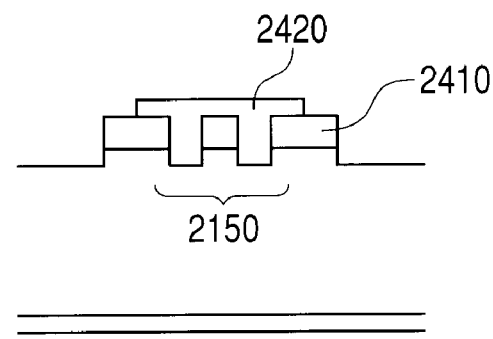

FIG. 1 is a cross-sectional diagram illustrating the configuration of a vertical cavity surface emitting laser according to the present embodiment. In FIG. 1, a surface emitting laser 100 includes a lower electrode 102, a substrate 104, an active layer 110, a lower spacer layer 108, an upper spacer layer 112 and a lower mirror 106. The surface emitting laser 100 also includes an upper mirror 114, a high Al proportion layer 115, a current confining structure 116, an insulating film 124, an upper electrode 126 and a light exit region 140.

A protruded surface relief structure is formed at the surface of the surface emitting laser 100 that corresponds to the light exit region 140 of the upper mirror 114.

Figure 5:
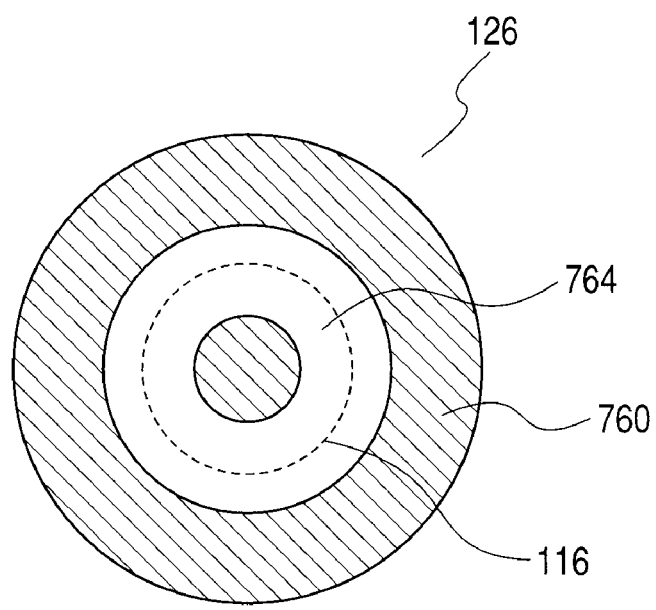
FIG. 5 is a top plan view of an optical surface relief structure and its surrounding area according to embodiment 1 of the present invention.
Figure 6A:
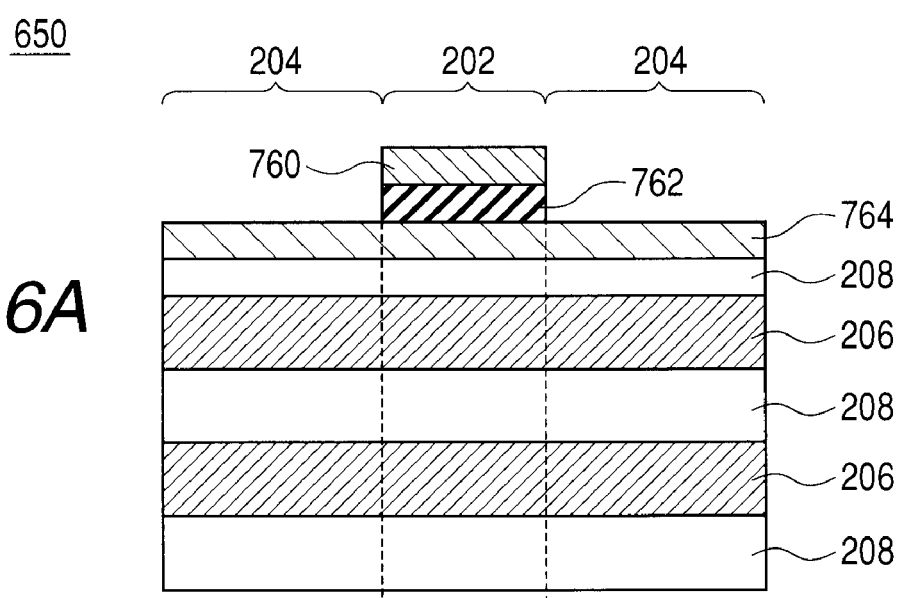
FIGS. 6A and 6B are cross-sectional diagrams illustrating a surface relief structure according to embodiments 1 and 2 of the present invention.

FIG. 5 is a top plan view of a surface relief structure and its surrounding area according to the present embodiment. FIG. 6A illustrates a protruded surface relief structure 650.

Figure 6B:
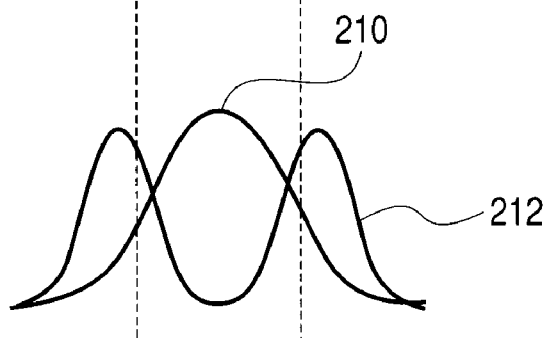

In the present embodiment, as illustrated in FIG. 6A, the center of the surface relief structure 650 and the center of the current confining structure are in agreement with each other, and also, the surface relief structure 650 is designed so that its center portion includes a high reflection region 202, and its peripheral portion includes a low reflection region 204. Here, as illustrated in FIG. 6B, a low reflection region 204 and a high-order transverse mode optical distribution 212 largely overlap with each other, while a fundamental transverse mode optical distribution 210 and the high reflection region 202 largely overlap with each other.

In the upper mirror 114, low refractive index layers 208 and high refractive index layers 206, each having an optical thickness of $\lambda/4$ relative to a lasing wavelength $\lambda$, are alternately stacked.

At the terminal end (upper side), the surface relief structure 650 is formed, and a first relief layer 760, a second relief layer 762 and a third relief layer 764, which are included in the surface relief structure 650, are formed in this order viewed from the side opposite the active layer.

In the protruded surface relief structure 650, the first relief layer 760 and the second relief layer 762 have been etched away in the low reflection region 204 while the first relief layer 760 being left in the high reflection region 202.

The total optical thickness of the first relief layer 760 and the second relief layer 762, and the total optical thickness of the third relief layer 764 and the low refractive index layer immediately below the relief layer 764 are designed so as to provide desired surface relief structure characteristics.

For example, where $\lambda$ is a lasing wavelength, each of the total optical thickness can be obtained by $\lambda/4 \times$(odd number).

Next, a vertical cavity surface emitting laser manufacturing method according to the present embodiment will be described.

The vertical cavity surface emitting laser manufacturing method according to the present embodiment enables stable formation of surface relief structures by means of the manufacturing process described below.

First, a lower mirror 106, a lower spacer layer 108, a quantum well active layer 110, an upper spacer layer 112 and an upper mirror 114 are made to grow on the semiconductor substrate 104 illustrated in FIG. 1.

For a growth method, for example, MOCVD (Metal-Organic Chemical Vapor Deposition) can be used.

The substrate 104 is, for example, an n-type GaAs substrate.

The lower mirror 106 includes, for example, alternately-stacked high refractive index layers and low refractive index layers, each having an optical thickness of $\lambda/4$, and is, for example, an n-type AlAs/Al0.5Ga0.5As multilayer reflecting mirror.

The lower spacer layer 108 is, for example, an n-type AlGaInP layer.

The quantum well active layer 110 is, for example, a multi-quantum well layer of GaInP/AlGaInP, and is designed so as to have an optical gain at the wavelength of 680 nm.

The upper spacer layer 112 is, for example, a p-type AlGaInP layer.

The upper mirror 114 includes, for example, alternately-stacked high refractive index layers and low refractive index layers, each having an optical thickness of $\lambda/4$, and is, for example, a p-type Al0.9Ga0.1As/Al0.5Ga0.5As multilayer reflecting mirror.

The thicknesses of the lower spacer layer 108 and the upper spacer layer 112 are designed so that: a standing wave with a resonance wavelength of $\lambda$ is formed between the lower mirror 106 and the upper mirror 114; and the loop of the standing wave is in the region of the active layer 110.

Some of the layers near the active layer of the upper mirror 114 are substituted with a high Al proportion layer 115, which can selectively be oxidized.

For example, the first low refractive index layer (of Al0.9Ga0.1As in the above example) from the active layer is substituted with an AlAs or Al0.98Ga0.02As layer.

Also, the uppermost portion of the upper mirror 114, the third relief layer 764, the second relief layer 762 and the first relief layer 760, which are illustrated in FIG. 6A, are deposited and made to grow in this order.

In other words, viewed from the light exit surface side of the upper mirror, these layers are arranged in the order of the first relief layer 760, the second relief layer 762 and the third relief layer 764.

The first relief layer 760 is, for example, a p-type GaAs layer.

The second relief layer 762 is, for example, a p-type Al0.5Ga0.5As layer, but may also include AlxGa1-xAs (x>0). Also, it may include AlxGa1-xAs (x>0.4).

Although the third relief layer 764 is, for example, a p-type (Al0.5Ga0.5)0.505In0.495P layer, the third relief layer 764 may include AlyGa1-yAs (y<x) or AlGaInP. Also, the third relief layer may include GaAs or AlwGazIn(1-w-z)P (w>0.3). Where the lasing wavelength of the surface emitting laser is λ, the total optical thickness of the first relief layer and the second relief layer may be an odd multiple of λ/4. Also, where M is an odd number, the total optical thickness of the first relief layer and the second relief layer may be set between λ/4 multiplied by M to λ/4 multiplied by M and plus 20 nm.

Next, a process for providing a surface relief structure to a wafer that has grown as described above will be described.

FIGS. 7A to 7I illustrate a method for manufacturing a vertical cavity surface emitting laser according to the present embodiment.

FIGS. 7A to 7I are diagrams illustrating the steps for manufacturing a surface emitting laser according to the present embodiment. First, in the step illustrated in FIG. 7A, a first resist layer 410 is applied to the side of the wafer on which deposition and growth have been made, and patterning for a surface relief structure and patterning for a mesa structure are simultaneously performed on the first resist 410 using one and the same mask. Here, the pattern for forming a mesa structure may be referred to as "first pattern", while the pattern for forming a surface relief structure being referred to as "second pattern".

Here, a protruded relief structure is illustrated as the surface relief structure. For example, the diameter of the high-reflectance region of the surface relief structure is, for example, 3 μmφ, the outer diameter of the low reflection region is 9 μmφ, and the diameter of the mesa structure is 26 μmφ.

Next, in the step illustrated in FIG. 7B, the first relief layer 760, which is the surface layer of the upper mirror, is etched using the patterned first resist 410 as a mask (the first-phase etching).

Etching of the first relief layer is performed by means of wet etching using, for example, a citric acid etchant, for example, a solution prepared by mixing solution A, hydrogen peroxide water, and water in the ratio (by volume) of 2:60:250 where solution A is a solution prepared by mixing citric acid monohydrate and water in the ratio (by weight) of 1:1.

As a result of the present inventors' experiments, this etchant exhibited a GaAs layer etching rate of 2 nm/second and an Al0.5Ga0.5As layer etching rate of less than 0.1 nm/second at a room temperature of 20° C. and thus, exhibited a selectivity of no less than 20:1.

Accordingly, when a GaAs layer is used for the first relief layer 760 and an Al0.5Ga0.5As layer is used for the second relief layer 762, in effect, only the first relief layer can be etched using the above-described etchant.

Next, in the step illustrated in FIG. 7C, a second resist 420 is applied and patterned so as to protect the region corresponding to a surface relief structure.

In this patterning, it is only necessary that the patterned second resist 420 cover the light exit region and be not left in the region to be etched away to form a mesa, and thus, the center of the patterned second resist is not necessarily required to agree with the centers of the mesa and the surface relief structure.

Next, in the step illustrated in FIG. 7D, a mesa structure is formed by means of etching, making a high Al proportion layer 115 be exposed. The etching is performed by, for example, dry etching, for example, reactive ion etching using SiCl4/Ar gas. As a result of this etching, the side surface of the high Al proportion layer 115, which can be selectively oxidized, is exposed.

Next, in the step illustrated in FIG. 7E, the first and second resists are removed, and a current confining structure 116 is formed in the high Al proportion layer 115, which can selectively be oxidized, by means of selective oxidation. The removal of the first resist 410 and second resist 420 is performed by, for example, ashing using oxygen plasma. Where residues of the resists remain, ozone ashing may further be performed.

The aperture diameter of the current confining structure 116 is, for example, 6 μm. The selective oxidation is performed by, for example, heating at 400° C. for around 30 minutes in a water vapor atmosphere furnace.

Before the selective oxidization, the mesa side surface may be washed with, for example, ammonia water for around one minute for stabilization of the selective oxidation.

In this step, there is a possibility that the second relief layer 762, which is a component of the surface relief structure, has been damaged.

More specifically, the surface may get rough as a result of the ashing using oxygen plasma. Also, in the selective oxidation, AlGaAs is more easily oxidized compared to GaAs, and thus, where the exposed second relief layer 762 includes Al0.5Ga0.5As, the layer may be oxidized in the depth of around several nanometers. The current confining structure may be formed by subjecting a part of a semiconductor included in any of the lower mirror, the active layer and the upper mirror to ion implantation.

Also, one or more current confining structures, each being formed by selectively oxidizing a current confining layer, may be provided among the lower mirror, the active layer and the upper mirror.

Next, in the step illustrated in FIG. 7F, an insulating film 124 is formed.

The insulating film 124 includes, for example, SiO₂, and the thickness of the layer is, for example, 200 nm. The formation of the insulating film is performed by, for example, plasma CVD.

Next, a third resist is applied onto the insulating film 124, and the third resist is patterned so that it is not left on the surface relief structure but is left outside the top of the mesa (not illustrated).

In the step illustrated in FIG. 7G, using the third resist as a mask, the part of the insulating film 124 corresponding to the surface relief structure is removed, and the third resist is removed.

For the etching of the insulating film, for example, a buffered hydrofluoric acid is used. For the removal of the third resist, for example, acetone is used, and residues of the third resist are removed by means of, for example, ozone ashing.

Next, in the step illustrated in FIG. 7H, the second relief layer 762 in the area in which etching has been performed in the step illustrated in FIG. 7B is etched away (the second-phase etching).

As a result of this step, a surface relief structure has been completed.

Before the etching of the second relief layer 762, the surface of the layer may be washed with, e.g., a hydrochloric acid for stabilization of the etching rate.

In this step, the second relief layer 762 damaged in the step of FIG. 7E (i.e., with the surface got rough or oxidized) is etched away.

As a result, a more stable shape compared to those in the related art can be provided to the surface relief structure.

Here, for etching the second relief layer 762, it is desirable to use an etchant that provides a certain selectivity between the second relief layer 762 and the first relief layer 760.

In other words, it is desirable that the second relief layer 762 can be etched using the first relief layer 760 as a mask.

It is desirable that the etching selectivity for the second relief layer be no less than three times that for the first relief layer. For example, where the first relief layer is a GaAs layer and the second relief layer is an Al0.5Ga0.5As layer, ammonia water can be used as an etchant.

As a result of the present inventors' experiments, the etching rates for GaAs and Al0.5Ga0.5As at a room temperature of 20° C. when 28 percent ammonia water is used as an etchant for the second etching were 0.16 nm/minute and 0.68 nm/minute, respectively.

The etching rate of 28 percent ammonia water, which is an etchant used in the present embodiment, for Al0.5Ga0.5As is no more than 10 nm/minute (it may be no more than 1 nm/minute). These rates are very slow compared to those of generally-used wet etching, and thus, cannot be employed in ordinary wet etching.

However, in formation of a surface relief structure, which is an object of the present invention, the surface relief structure is formed in the depth of several tens of nanometers, and thus, the aforementioned etching rates are very effective for the formation because it makes easy to perform fine control in etching to form the relief.

According to Vukusic et al., the reflectance of a protruded surface relief structure is not largely lowered even if the interface of the protruded portion, which is a high reflectance region, is slightly cut away.

Meanwhile, in the recessed portion, which is a low reflection region, a minute difference in etch depth largely affects the reflectance.

Accordingly, the surface emitting laser manufacturing method according to the present embodiment can be regarded as a favorable method for forming a protruded surface relief structure.

For the control of the etch depth of the second relief layer 762, the etching may be stopped by means of time control as in Unold et al., or may also be stopped using an etching stop layer (third relief layer 764).

A more accurate depth can be provided by performing the control using an etching stop layer, rather than time control.

For third relief layer 764, for example, a GaAs layer can be used, but, for example, an AlGaInP layer, more specifically, an (Al0.5Ga0.5)0.505In0.495P layer can be used.

As a result of the present inventors' experiments, the etching rate of an (Al0.5Ga0.5)0.505In0.495P layer at a room temperature of 20° C. when 28 percent ammonia water is used as an etchant for the second etching is 0.03 nm/minute. For example, an Al0.5Ga0.5As layer is used for the second relief layer, the selectivity of the second relief layer is no less than ten times that of the third relief layer will be provided.

Accordingly, in this case, the third relief layer 764 can serve as a very practical etching stop layer.

Next, in the step illustrated in FIG. 7I, an upper electrode 126 is formed on the top of the mesa, and a lower electrode (not illustrated) is formed on the back side of the substrate 104. The upper electrode 126 includes a light emitting portion provided with an aperture.

This upper electrode 126 is formed by patterning a liftoff resist so that it is left in the light exit region 140, depositing, for example, Ti/Au on the upper multilayer reflecting mirror side by means of electron beam evaporation, and performing liftoff of the liftoff resist with, for example, acetone.

The lower electrode is formed by performing vapor deposition of, for example, AuGe/Au on the entire substrate back side by means of resistance heating.

Through the above-described steps, the surface emitting laser 100 has been completed as an element in a wafer. Subsequently, the light exit surface may be sealed with, e.g., a resin for protection of the light exit surface.

Embodiment 2

A vertical cavity surface emitting laser according to embodiment 2 has a configuration similar to that of the vertical cavity surface emitting laser according to embodiment 1, but is different from embodiment 1 in the process of forming its surface relief structure.

FIGS. 8A to 8M are diagrams illustrating a vertical cavity surface emitting laser manufacturing method according to the present embodiment.

Figure 8A:
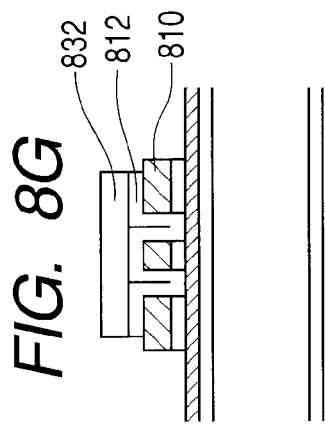
FIGS. 8A, 8B, 8C, 8D, 8E, 8F, 8G, 8H, 8I, 8J, 8K, 8L and 8M are diagrams illustrating a method for manufacturing a vertical cavity surface emitting laser according to embodiment 2 of the present invention.

First, in the step illustrated in FIG. 8A, a first dielectric layer 810 is formed on the side of a wafer on which deposition and growth has been made.

The first dielectric layer 810 includes, for example, $SiO_2$. The film formation is performed by means of, for example, plasma CVD. The first dielectric layer 810 has a thickness of, for example, 1 μm.

Figure 8B:
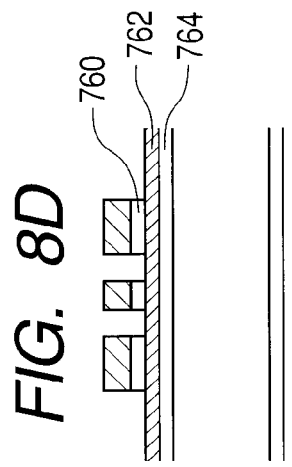

Next, in the step illustrated in FIG. 8B, a first resist 830 is applied onto the first dielectric layer 810, that is, above an upper mirror 114 to perform patterning for a surface relief structure and patterning for mesa structure simultaneously using one and the same mask.

Figure 8C:
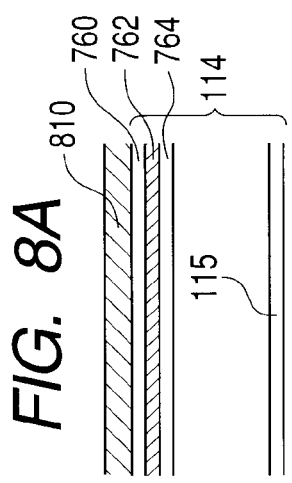

Next, in the step illustrated in FIG. 8C, the first dielectric layer 810 is etched using the patterned first resist 830 as a mask.

For example, if the first dielectric layer 810 includes $SiO_2$, the etching can be performed using a buffered hydrofluoric acid.

Figure 8D:
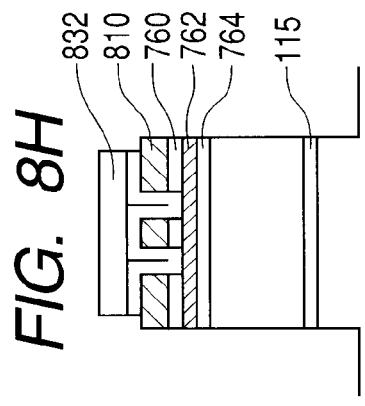

Next, in the step illustrated in FIG. 8D, the first resist 830 is completely removed, and the first relief layer 760 is etched using the first dielectric layer 810 as a mask.

The removal of the first resist 830 is performed with, for example, acetone, and if residues of the first resist 830 remain after washing with IPA, such residues can be removed by means of ozone ashing.

The etching of the first relief layer 760 is performed by means of wet etching using, for example, a citric acid etchant, for example, a solution prepared by mixing solution A, hydrogen peroxide water, and water in the ratio (by volume) of 2:60:250 where solution A is a solution prepared by mixing citric acid monohydrate and water in the ratio (by weight) of 1:1.

Figure 8E:
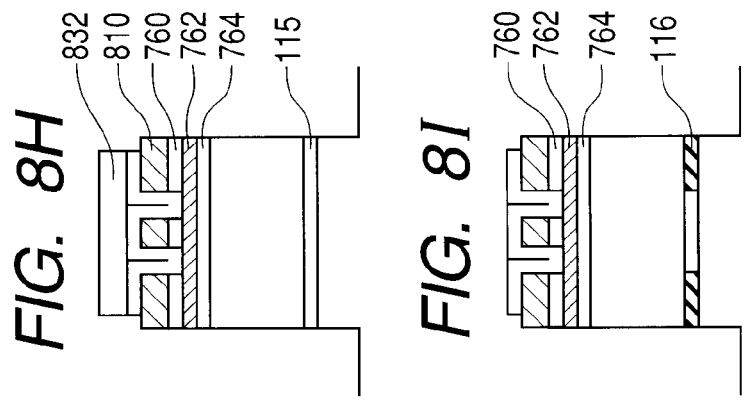

Next, in the step illustrated in FIG. 8E, a second dielectric layer 812 is formed. The second dielectric layer 812 includes, for example, $SiO_2$.

The formation is performed by, for example, plasma CVD. The second dielectric layer 812 has a thickness of, for example, 100 nm.

Figure 8F:
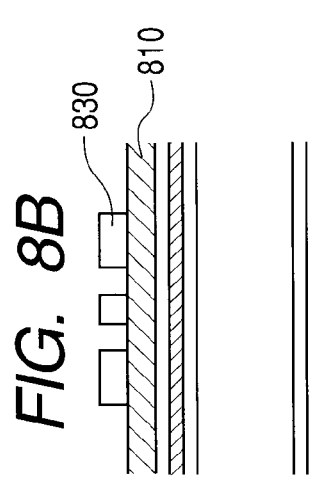

Next, in the step illustrated in FIG. 8F, a second resist 832 is applied onto the second dielectric layer 812, and patterned so as to protect the surface relief structure.

In this patterning, it is only necessary that the patterned second resist 832 cover the light exit region and be not left in the region etched away to form a mesa, and thus, the center of the patterned second resist is not necessarily required to agree with the centers of the mesa and the surface relief structure.

Figure 8G:
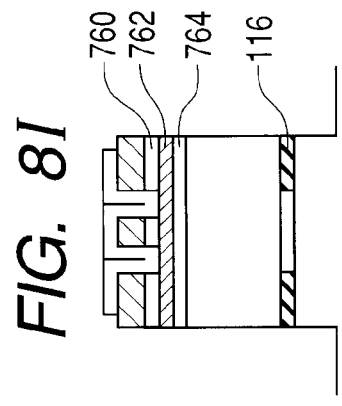

Next, in the step illustrated in FIG. 8G, the second dielectric layer 812 is etched using the patterned second resist 832 as a mask.

For example, if the second dielectric layer 812 includes $SiO_2$, the etching can be performed using a buffered hydrofluoric acid.

In this case, the first dielectric layer 810 may be somewhat etched, and accordingly, the first dielectric layer 810 is provided with a thickness larger than that of the second dielectric layer 812 to adjust the time of the etching.

Consequently, it is possible to leave the first dielectric layer 810 in a thickness necessary for a mask in etching in the next step.

Figure 8H:
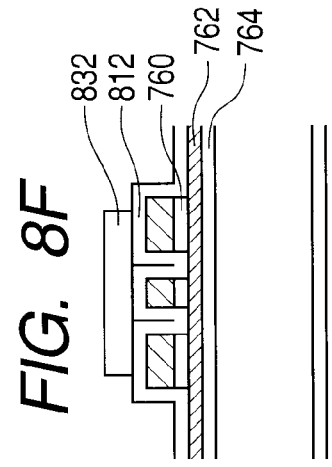

Next, in the step illustrated in FIG. 8H, a mesa structure is formed by means of etching using the patterned second resist 832 and the first dielectric layer 810 as masks. The etching is performed by, for example, dry etching, for example, reactive ion etching using SiCl4/Ar gas.

As a result of this etching, the side surface of a layer 115, which can selectively be oxidized, is exposed.

Figure 8I:
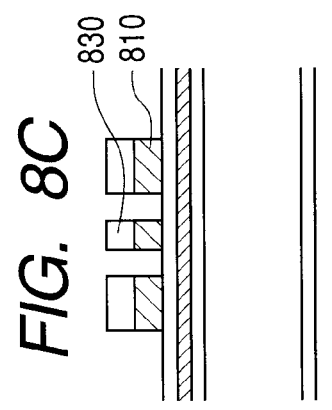

Next, in the step illustrated in FIG. 8I, the second resist 832 is removed, and a current confining structure 116 is formed in the high Al proportion layer 115, which can selectively be oxidized, by means of selective oxidation.

The removal of the second resist 832 is performed by, for example, ashing using oxygen plasma. Where residues of the resist remain, ozone ashing may further be performed.

The selective oxidization is performed by, for example, heating at 400° C. for around 30 minutes in a water vapor atmosphere furnace.

Before the selective oxidation, the mesa side surface may be washed with, for example, ammonia water for around one minute for stabilization of the selective oxidation.

Figure 8J:
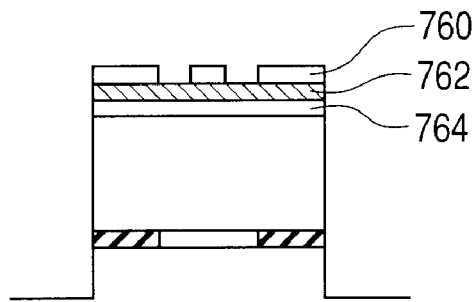

Next, in the step illustrated in FIG. 8J, the first dielectric layer 810 and the second dielectric layer 812 are completely removed.

The removal of the first dielectric layer 810 and the second dielectric layer 812 is performed by means of, for example, etching using a buffered hydrofluoric acid.

Figure 8K:
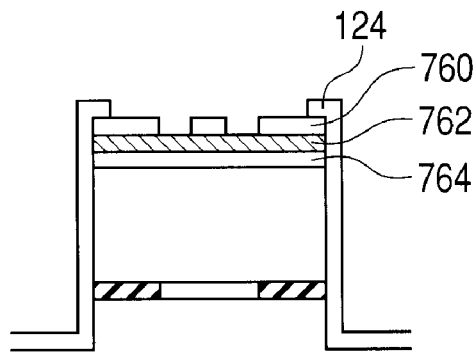

Next, in the step illustrated in FIG. 8K, a third dielectric layer (insulating film) 124 is formed, and a third resist is applied onto the third dielectric layer 124.

Then, the third resist is patterned so that it is not left on the surface relief structure, but is left outside the top of the mesa. The third dielectric layer 124 in the area corresponding to the surface relief structure is removed using this third resist as a mask, and the third resist is removed.

The third dielectric layer 124 includes, for example, $SiO_2$, and has a thickness of, for example, 200 nm.

The formation of the third dielectric layer 124 is performed by means of, for example, plasma CVD. For etching of the third dielectric layer 124, for example, a buffered hydrofluoric acid is used. For the removal of the third resist, for example, acetone is used, and residues of the third resist are removed by, for example, ozone ashing.

Figure 8L:
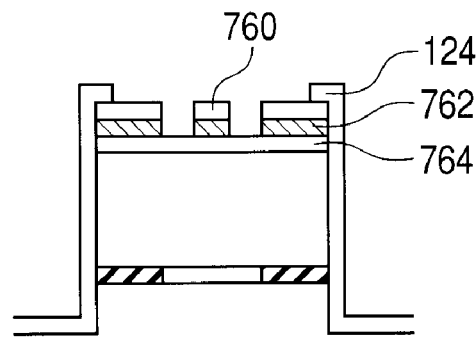

Next, in the step illustrated in FIG. 8L, the second relief layer 762 is etched.

As a result of this step, a surface relief structure has been completed. Before the etching of the second relief layer 762, the surface may be washed using, e.g., a hydrochloric acid for stabilization of the etching rate.

Here, for etching the second relief layer 762, it is desirable to use an etchant that provides a certain selectivity between the second relief layer 762 and the first relief layer 760.

In other words, it is desirable that the second relief layer 762 can be etched using the first relief layer 760 as a mask.

Furthermore, it is desirable that the etching selectivity for the second relief layer be no less than three times that for the first relief layer.

For example, where the first relief layer is a GaAs layer and the second relief layer is an Al0.5Ga0.5As layer, as in embodiment 1, ammonia water can be used as an etchant.

For the control of the etch depth of the second relief layer, the etching may be stopped by means of time control, or may also be stopped using an etching stop layer (third relief layer 764).

For the third relief layer, for example, a GaAs layer can be used, but, for example, an AlGaInP layer, more specifically, for example, a (Al0.5Ga0.5)0.505In0.495P layer can be used.

Figure 8M:
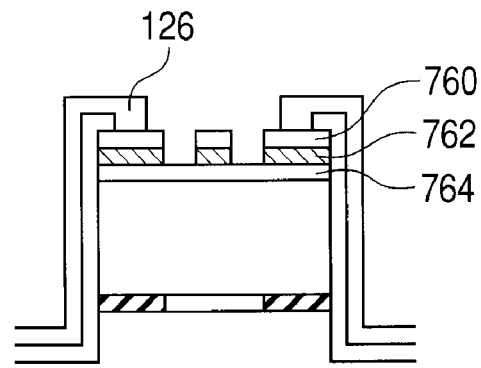

Next, in the step illustrated in FIG. 8M, as in embodiment 1, an upper electrode 126 is formed on the top of the mesa, and a lower electrode (not illustrated) is formed on the back side of the substrate 104. Subsequently, the light exit surface may be sealed with, e.g., a resin to protect the light exit surface.

Where GaAs is used for the first relief layer 760 to use the layer as a contact layer, it is desirable that the first relief layer 760 have a thickness of no less than 20 nm because a thicker layer is favorable for contact.

However, in the case of, for example, a layer in the red wavelength band, a GaAs layer serves as a light absorbing layer, and thus, it is favorable that the first relief layer 760 is not so thick. Also, if the second relief layer 762 is thin, the second relief layer 762 may completely be etched away due to damage caused in the course of the process, before the proper step of etching the second relief layer 762, resulting in the third relief layer 764 being exposed. For example, considering the case where an AlGaInP layer is used as the third relief layer 764 and a buffered hydrofluoric acid is used for dielectric layer removal, the AlGaInP layer may dissolve in the buffered hydrofluoric acid depending on the proportions. Thus, it is not favorable that the second relief layer 762 is etched before the proper etching step is performed for the second relief layer 762, resulting in the third relief layer 764 being exposed.

The process according to the present embodiment provides an advantage in that even a material (for example, AlGaInP) that is etched by an etchant (for example, a buffered hydrofluoric acid) used for, e.g., dielectric layer removal process can be used for an etching stop layer.

Meanwhile, if the second relief layer 762 is thin, the etching time can be reduced.

Even when an etchant causing the first relief layer 760 to be somewhat etched during etching of the second relief layer 762 is used, the etching amount of the first relief layer 760 can be reduced.

Embodiment 3

As embodiment 3, an example configuration of a vertical cavity surface emitting laser that is different from the above embodiments will be described.

A vertical cavity surface emitting laser according to the present embodiment has a configuration similar to the vertical cavity surface emitting laser according to embodiment 2 described above.

However, the vertical cavity surface emitting laser is different from embodiment 2 in that in the process of forming a surface relief structure, the third relief layer is etched after formation of an electrode.

FIGS. 9A and 9B are cross-sectional diagrams of a surface relief structure in a light exit region and in the vicinity of an upper electrode according to the present embodiment.

A surface relief structure 950 according to the present embodiment is different from the surface relief structure 650 according to embodiment 2 in that the thickness of a first relief layer 760 formed below an upper electrode 126 is larger than the thickness of the first relief layer 760 left in the light emitting portion.

The vertical cavity surface emitting laser according to the present embodiment is manufactured by a process that is partially in common to the process of embodiment 2.

Figure 10A:
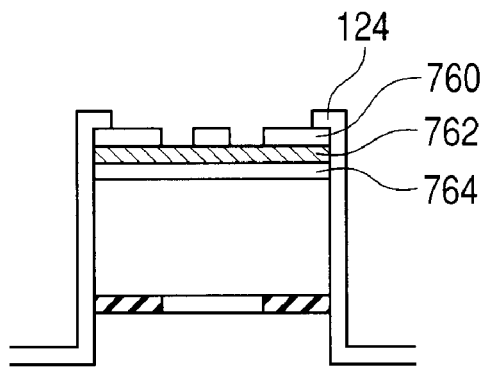
FIGS. 10A, 10B and 10C are process diagrams illustrating a method for manufacturing a vertical cavity surface emitting laser according to embodiment 3 of the present invention.
Figure 10B:
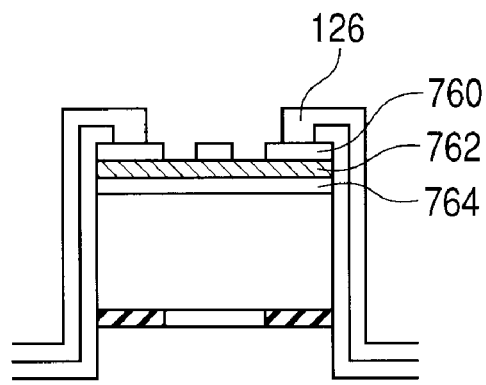
Figure 10C:
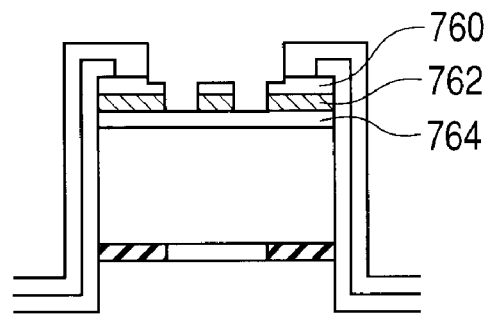

FIGS. 10A to 10C are process diagrams illustrating a method for manufacturing the vertical cavity surface emitting laser according to the present embodiment, which illustrate the process after the completion of the process in FIGS. 8A to 8K. FIG. 10A corresponds to FIG. 8K.

In the present embodiment, in the step illustrated in FIG. 10A, after etching of a third dielectric layer 124 and removal of a third resist (illustrated), as illustrated in FIG. 10B, an upper electrode 126 is formed on the top of the mesa.

The upper electrode 126 includes a light emitting portion provided with an aperture. The upper electrode 126 is formed by patterning a liftoff resist so that it is left in the light emitting portion, depositing, for example, Ti/Au by means of electron beam evaporation, and performing liftoff of the liftoff resist with, for example, acetone.

Next, in the step illustrated in FIG. 10C, a second relief layer 762 is etched. For a method for etching the second relief layer, the same technique as that in embodiment 2 can be used. As a result of this step in FIG. 10C, a surface relief structure is completed. The surface may be washed with, e.g., a hydrochloric acid before the etching of the second relief layer 762, for stabilization of the etching rate.

Here, as described in embodiment 2, during the etching of the second relief layer 762, the first relief layer 760 may also be somewhat etched.

If the first relief layer 760 is a highly-doped contact layer, current injection from the upper electrode 126 to an active layer 110 can efficiently be performed.

However, if after the second etching, that is, the thickness of the first relief layer 760 has been reduced, the upper electrode 126 is provided as in embodiment 2, there is a possibility that sufficient contact cannot be provided.

Meanwhile, a highly-doped contact layer absorbs more light by the amount of doping, and thus, if the thickness of the contact layer is increased, the laser light extraction efficiency will be lowered. Also, although it is common to use a GaAs layer as a contact layer, in a red-wavelength-band surface emitting laser, a GaAs layer serves as a light absorbing layer, and thus, cannot be made to be thick.

However, in the process according to embodiment 3, during etching of the second relief layer 762, the previously-provided upper electrode 126 protects the contact layer positioned below the upper electrode 126, and thus, the thickness of the contact layer is not reduced.

The first relief layer 760 in the light emitting portion is somewhat etched.

Accordingly, the process of embodiment 3 more reliably provides good contact than the process of embodiment 2 if the thickness of the first relief layer 760 in the light exit region is the same as that of embodiment 2.

Also, in the case to provide the same degree of contact between embodiment 2 and embodiment 3, the amount of light absorption can be reduced in the process of embodiment 3 by the amount of the reduction of the thickness of the first relief layer 760 in the light exit region, compared to the process of embodiment 2, increasing the laser light extraction efficiency.

The first relief layer 760 and the second relief layer 762 have thicknesses designed allowing for the first relief layer 760 in the light exit region being cut away, and are made to grow on the wafer.

For example, it is assumed that: the first relief layer 760 is a GaAs layer with a thickness of 20 nm; the second relief layer 762 is an Al0.5Ga0.5As layer with a thickness of 25 nm; and the third relief layer 764 is an AlGaInP layer.

In this case, in the step of etching the second relief layer 762, which is illustrated in FIG. 10C, use of 28 percent ammonia water as an etchant at 20° C. is considered.

At 20° C., the etching rate of an Al0.5Ga0.5As layer by 28 percent ammonia water is 0.68 nm/minute.

Accordingly, if etching is performed for, for example, 40 minutes, the Al0.5Ga0.5As layer can completely be etched, resulting in the AlGaInP layer, which is the third relief layer 764, being exposed. However, here, the etching rate of the GaAs layer, which is the first relief layer 760, is 0.16 nm/minute, and thus, the GaAs layer is etched in the depth of 6 nm.

As a result, if an upper electrode is subsequently provided as in the process of embodiment 2, the GaAs contact layer will have a thickness of 14 nm, which cannot be considered to provide good contact.

However, in the process of embodiment 3, the upper electrode has previously been provided, and thus, the GaAs contact layer below the upper electrode has a thickness of 20 nm, enabling provision of good contact.

On the other hand, the first relief layer 760 can be formed so as to be 6 nm thicker in advance, allowing for the first relief layer 760 being etched during the etching of the second relief layer 762.

In this case, a GaAs contact layer with a thickness of 26 nm is provided below the upper electrode, enabling provision of further favorable contact.

In addition, embodiment 3 provides another advantage. In, e.g., the liftoff resist patterning and upper electrode liftoff in FIG. 10A, the surface of the semiconductor in the surface relief structure may be damaged.

For example, when resides of the resist are generated as a result of liftoff, an attempt will be made to remove the residues by means of, e.g., ozone ashing. However, if the energy of the ashing is large, the semiconductor surface of the surface relief structure may be damaged.

However, in the method of embodiment 3, the second relief layer is subsequently etched to form a surface relief structure, and thus the surface damaged by the ashing is etched, reducing the effect of the damage.

Embodiment 4

As embodiment 4, an example configuration of a vertical cavity surface emitting laser, which is different from those of the above-described embodiments, will be described.

Figure 11:
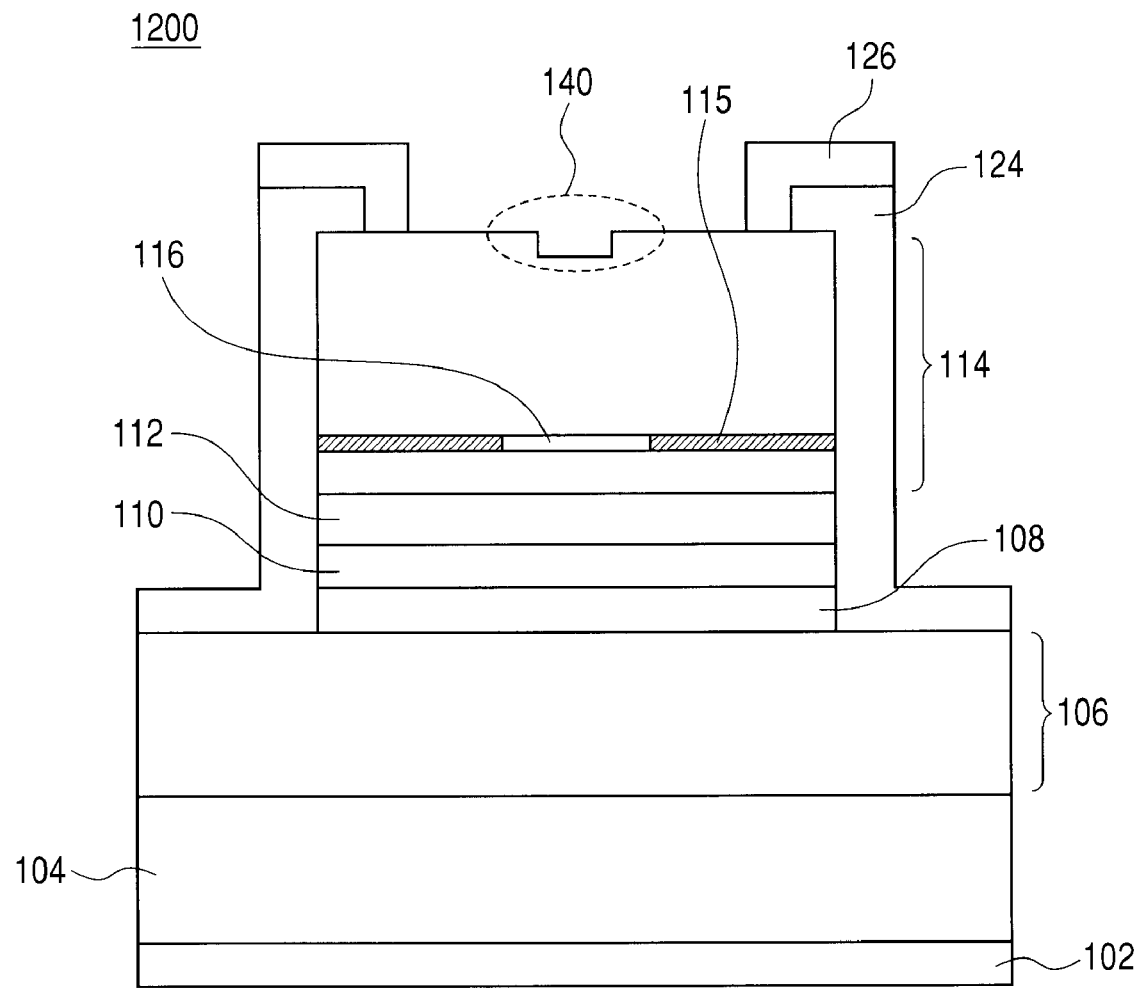
FIG. 11 is a cross-sectional diagram illustrating a vertical cavity surface emitting laser according to embodiment 4 of the present invention.

FIG. 11 is a schematic diagram illustrating a cross-section of a vertical cavity surface emitting laser 1200 according to the present embodiment.

Figure 12A:
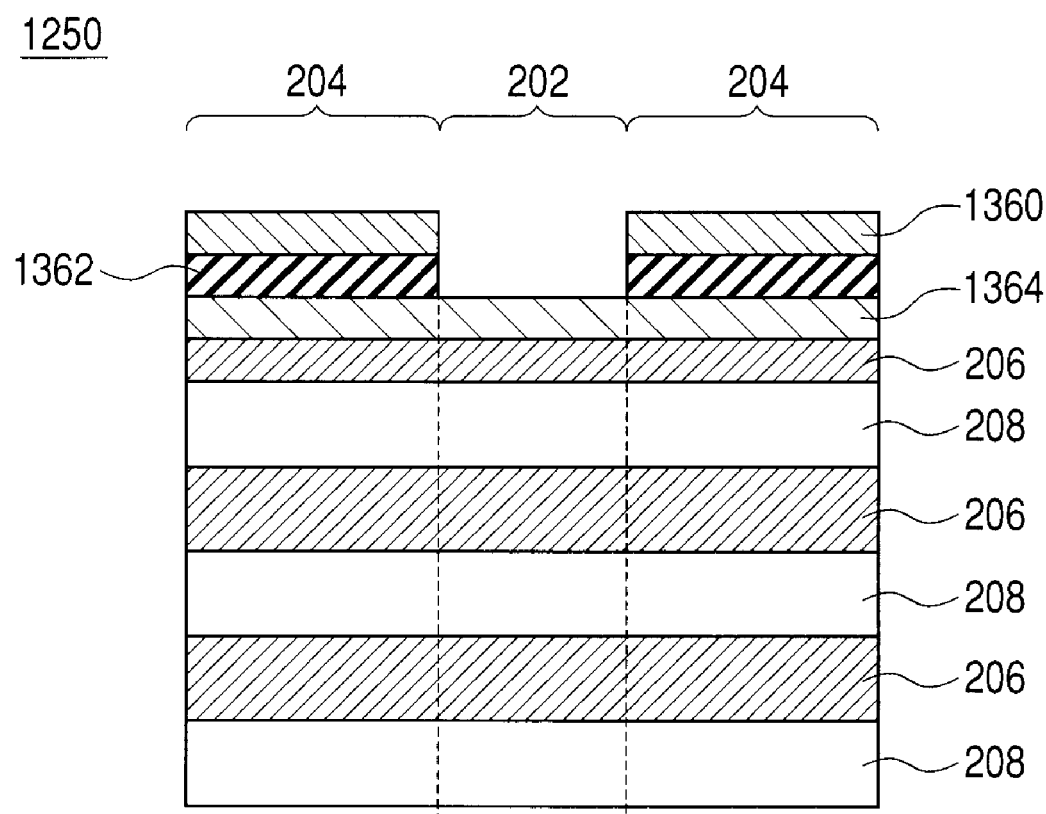
FIGS. 12A and 12B are cross-sectional diagrams of a surface relief structure according to embodiment 4 of the present invention.
Figure 12B:
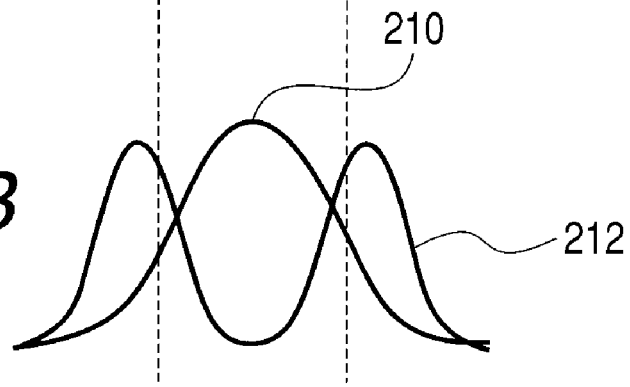

FIGS. 12A and 12B are schematic diagrams illustrating a cross-section of a surface relief structure at a light emitting portion of the vertical cavity surface emitting laser 1200 according to embodiment 4.

The vertical cavity surface emitting laser according to the present embodiment is largely in common to the surface emitting lasers according to embodiments 1 to 3.

However, as illustrated in FIG. 11, the vertical cavity surface emitting laser according to embodiment 4 is different from embodiments 1 to 3 in that a surface relief structure provided in a light exit region 140 at the top of an upper mirror 114 is a recessed structure.

A surface relief structure 1250 according to the present embodiment will be described in details using FIGS. 12A and 12B.

In the upper mirror 114, low refractive index layers 208 and high refractive index layers 206, each having an optical thickness of $\lambda/4$ relative to a lasing wavelength $\lambda$, are alternately stacked.

At the terminate end (the top side), the surface relief structure 1250 is formed as illustrated in FIG. 12A: a first relief layer 1360, a second relief layer 1362 and a third relief layer 1364 are stacked in this order viewed from the side opposite to an active layer.

In other words, a part of the top side of the uppermost high refractive index layer of the upper mirror is substituted with the third relief layer 1364.

In the recessed surface relief structure 1250, the first relief layer 1360 and the second relief layer 1362 are etched away in a high reflection region 202, which is a center portion, while the first relief layer 1360 is left in a low reflection region 204, which is a peripheral portion.

The total optical thickness of the first relief layer 1360 and the second relief layer 1362 in the low reflection region, and the total optical thickness of the third relief layer 1364 and the high refractive index layer immediately below the third relief layer 1364 are respectively designed so as to provide desired surface relief structure characteristics.

For example, each of the total optical thicknesses is $\lambda/4$ or $\lambda/4+\lambda/2\times$(integer).

The first relief layer is, for example, a p-type GaAs layer.

The second relief layer is, for example, a p-type Al0.5Ga0.5As layer.

The third relief layer is, for example, a p-type AlGaInP layer.

The vertical cavity surface emitting laser 1200 according to the present embodiment can be manufactured by means of a method similar to the methods disclosed in embodiments 1 to 3.

In other words, the vertical cavity surface emitting laser 1200 according to the present embodiment can be manufactured by the method of etching the first relief layer 1360 before formation of a current confining structure, and etching the second relief layer 1362 after formation of the current confining structure to form a surface relief structure.

In the case of a recessed surface relief, the reflectance is low in the region in which the first relief layer 1360 and the second relief layer 1362 are left.

Furthermore, a low reflectance surface may require a higher accuracy in the position of the interface with the air compared to a high reflectance surface.

Accordingly, where the first relief layer 1360 is slightly cut away during etching of the second relief layer 1362, the first relief layer 1360 can be formed to be thicker in advance considering the amount of the layer to be cut away.

For example, a surface emitting laser including a recessed surface relief structure including a first relief layer 1360 of 20 nm and a second relief layer 1362 of 25 nm is finally manufactured.

In this case, if the first relief layer is cut away in the depth of, for example, 6 nm during the process (for example, etching the second relief layer), the first relief layer can be formed so as to have a thickness of 26 nm in the original wafer.

Embodiment 5

In embodiment 5, an example configuration of an optical apparatus configured using a vertical cavity surface emitting laser according to the present invention will be described.

Any of the surface emitting lasers and their manufacturing methods disclosed in embodiments 1 to 4 can be applied to a surface emitting laser array and its manufacturing method.

Furthermore, as an application of the surface emitting laser array, an optical apparatus using a laser array of the surface emitting lasers can be provided.

A surface emitting laser array is formed in such a manner that a plurality of surface emitting lasers is monolithically arranged in one dimension or two dimensions on a wafer.

The space between the respective elements of surface emitting lasers is, for example, 50 μm.

In general, it is most often the case that a surface emitting laser array device is required to have no characteristic variation of the individual lasers in the array.

Also, from the perspective of production, a high yield rate (i.e., many desired array devices can be obtained from one wafer, and desired devices can stably be obtained from any wafer) is demanded.

In other words, it is desirable to have array devices with uniform characteristics in the plane of a wafer and also between wafers.

According to the present invention, the positions of a surface relief structure and a current confining structure are simultaneously determined, and thus, the problem of θ-displacement in alignment will not arise, enabling the element characteristic variation in an array as well as in a wafer.

Furthermore, two-phase formation of a surface relief structure can reduce characteristic variation caused by damage of the surface relief structure during the process, enabling provision of array devices, which have less variation between wafers.

Figure 13A:
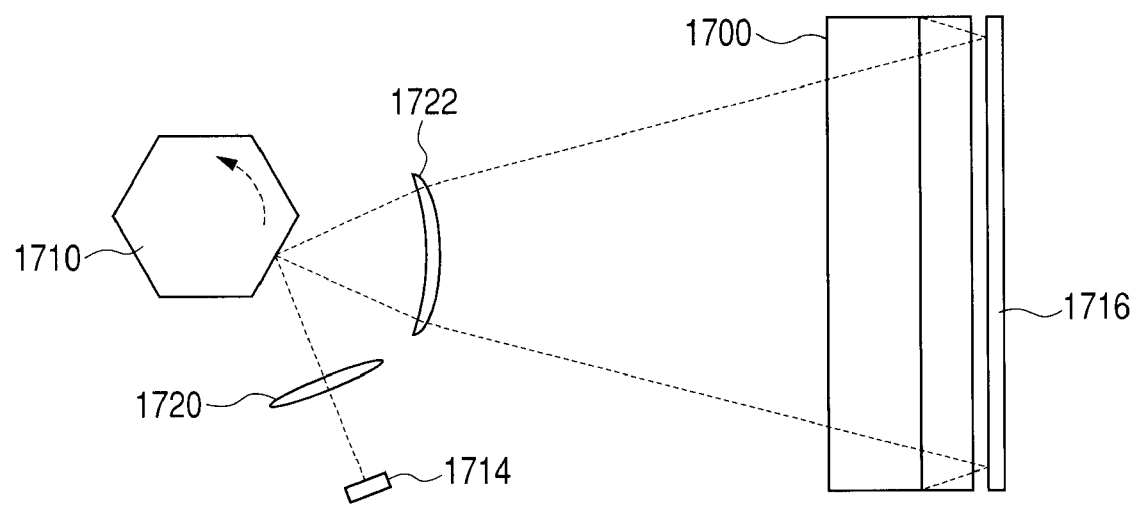
FIGS. 13A and 13B are diagrams illustrating an image forming apparatus including a laser array of vertical cavity surface emitting lasers according to embodiment 5 of the present invention.
Figure 13B:
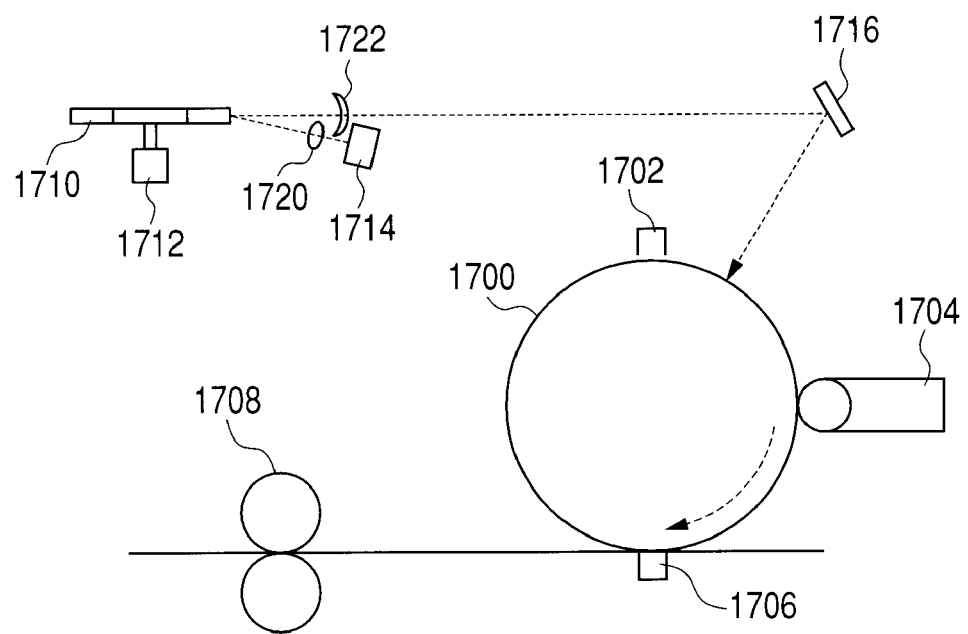

Here, as an optical apparatus, an example configuration of an image forming apparatus configured using a red surface emitting laser array of the vertical cavity surface emitting lasers according to the present invention will be described. FIGS. 13A and 13B illustrate the structure of an electrophotographic recording-type image forming apparatus that includes a surface emitting laser array according to the present invention.

FIG. 13A is a plan view of the image forming apparatus, and FIG. 13B is a side view of the apparatus.

As illustrated in FIGS. 13A and 13B, the image forming apparatus includes a photosensitive drum (photoreceptor) 1700, a charger 1702, a developing unit 1704, a transfer charger 1706, a fuser unit 1708, a rotary polygon mirror 1710 and a motor 1712. The apparatus also includes a vertical cavity surface emitting laser array 1714, a reflecting mirror 1716, a collimator lens 1720 and an f-θ lens 1722.

In FIGS. 13A and 13B, the motor 1712 is driven to rotate the rotary polygon mirror 1710.

The rotary polygon mirror 1710 according to the present embodiment includes six reflection surfaces.

The vertical cavity surface emitting laser array 1714, which serves as a light source for recording, is configured so as to be turned on or off by a laser driver according to image signals (not illustrated). Laser light optically modulated as described above is applied from the vertical cavity surface emitting laser array 1714 toward the rotary polygon mirror 1710 via the collimator lens 1720. The rotary polygon mirror 1710 rotates in the direction of an arrow, and the laser light output from the vertical cavity surface emitting laser array 1714 is reflected as a deflected beam whose emission angle sequentially changes according to the reflection surface, along with the rotation of the rotary polygon mirror 1710.

This reflected light is subjected to, e.g., correction to remove distortion aberration, by means of the f-θ lens 1722, and is applied to the photosensitive drum 1700 via the reflecting mirror 1716 to scan on the photosensitive drum 1700 in a main scanning direction. Here, as a result of reflection of the beam light via one surface of the rotary polygon mirror 1710, an image for a plurality of lines corresponding to the vertical cavity surface emitting laser array 1714 is formed in the main scanning direction on the photosensitive drum 1700.

In the present embodiment, a 4×8 vertical cavity surface emitting laser array 1714 is used, and thus, an image for 32 lines is formed.

The photosensitive drum 1700 is charged in advance by the charger 1702, and sequentially exposed by means of laser light scanning, forming an electrostatic latent image.

Also, the photosensitive drum 1700 rotates in the direction of an arrow, and the formed electrostatic latent image is developed by means of the developing unit 1704, and the developed visible image is transferred to transfer paper (not illustrated) by means of the transfer charger 1706.

The transfer paper onto which the visible image has been transferred is carried to the fuser unit 1708 and after being subjected to fusing, is ejected to the outside of the apparatus.

The laser light reflected by the respective reflection surfaces of the rotary polygon mirror 1710 is detected by a BD sensor ahead of line scanning.

This detection signal is input to a timing controller (not illustrated) as a main scanning direction scanning start reference signal, and with reference to this signal, the scanning direction write start positions in the respective lines are synchronized.

Although in the present embodiment, a 4×8 vertical cavity surface emitting laser array has been used, the vertical cavity surface emitting laser according to the present invention is not limited to this example, and an m×n vertical cavity surface emitting laser array (m and n are natural numbers (other than 0)) may be employed.

The semiconductor, electrode and dielectric materials, etc., are not limited to the materials disclosed in the embodiments, and it should be understood that any other materials can be used as long as they do not deviate from the spirit of the present invention.

Also, for the method for manufacturing the surface emitting laser, also, addition and substitution of other steps (for example, addition of a washing step in the process) can be made as long as such step addition and substitution is within the scope of the present invention.

Furthermore, for the etchants disclosed in the embodiments, which are used for semiconductor and/or dielectric material etching, any etchants can be employed as long as they are within the scope of the present invention.

For example, for etching the second relief layer, not only 28 percent ammonia water but also an alkali solution such as an NaOH aqueous solution or a KOH aqueous solution or an acidic etchant such as an ammonium salt solution or a hydrofluoric acid etchant, etc., can be used.

Also, in the present embodiment, an object is set to make the 0-order transverse mode be a signal mode in the mode control by means of a surface relief structure, and thus, the relief structure that divides the surface into two regions, i.e., the center and peripheral portions of the light exit region.

However, it is also possible to suppress $0^{th}$-order mode lasing and provide lasing in another particular high-order mode, using a surface relief structure.

Also, various shapes and sizes can be employed for the surface relief structure to provide a surface emitting laser with desired optical characteristics.

Although the above description has been provided in terms of an example in which an image forming apparatus is configured as an optical apparatus, the present invention is not limited to such configuration.

For example, an optical apparatus such as a projection display may be configured using a light source configured using vertical cavity surface emitting lasers according to the present invention, and making light from the light source enter an image display to display an image.

Embodiment 6

In embodiment 6, an example configuration of a vertical cavity surface emitting laser in which the optical mode is controlled by multiple etching pits forming a photonic crystal will be described.

Figure 14:
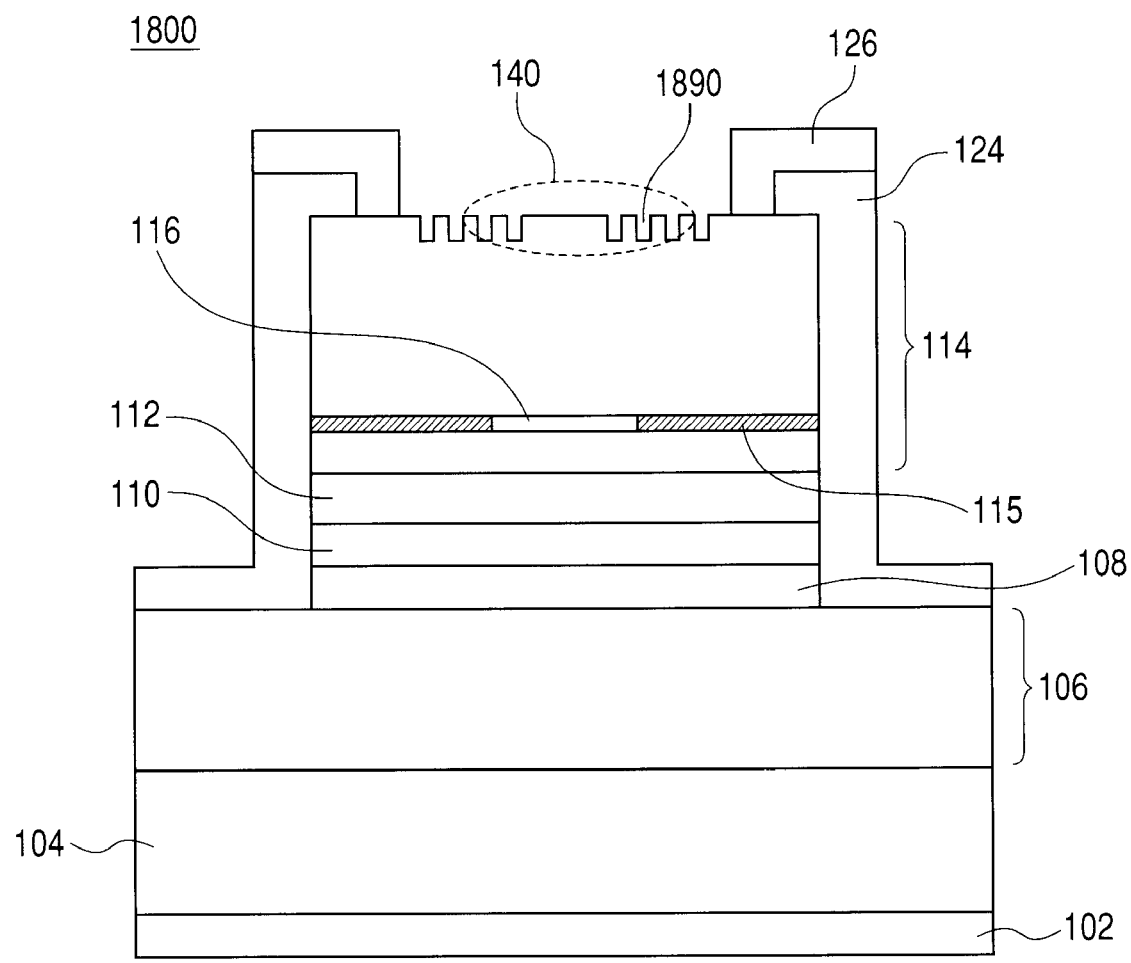
FIG. 14 is a cross-sectional diagram illustrating a vertical cavity surface emitting laser according to embodiment 6 of the present invention.

FIG. 14 is a cross-sectional diagram illustrating the configuration of a vertical cavity surface emitting laser according to the present embodiment. In FIG. 14, multiple etching pits 1890 forming a photonic crystal are provided. In the present invention, the number of etched portions in a surface relief is not limited to one, and a plurality of etched portions may be provided. Also, the present invention can also be applied to, for example, a vertical cavity surface emitting laser that controls the optical mode by means of the etching pits 1890, which is what is called a "photonic crystal surface emitting laser", like that illustrated in FIG. 14.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Laid-Open No. 2008-198951, filed Jul. 31, 2008, which is hereby incorporated by reference herein in its entirety.

What is claimed is:

1. A surface emitting laser manufacturing method for manufacturing a surface emitting laser that includes a surface relief structure, the method comprising steps of:
    stacking, in order, a lower mirror, an active layer, an upper mirror, a third relief layer, a second relief layer, and a first relief layer;
    forming a resist pattern including a first pattern for forming a mesa structure and a second pattern for forming the surface relief structure, on or above the first relief layer;
    performing a first-phase etching for etching the first relief layer using the resist pattern to determine a horizontal position of the surface relief structure;
    forming a current confining structure that constrains current injected into the active layer, after the performing of the first-phase etching; and
    performing a second-phase etching for etching the second relief layer, which is exposed by the etching of the first relief layer, to determine a depth position of the surface relief structure, after the forming of the current confining structure,
    wherein the surface relieve structure is formed from the third relief layer, the second relief layer, and the first relief layer stacked in the order of the stacking step.

2. The surface emitting laser manufacturing method according to claim 1, wherein the first pattern and the second pattern are formed using a same mask.

3. The surface emitting laser manufacturing method according to claim 1, wherein at least one of: a substrate, the lower mirror, the active layer, and the upper mirror include a semiconductor.

4. The surface emitting laser manufacturing method according to claim 3,
wherein the current confining structure is formed by subjecting a part of the semiconductor included in any of the lower mirror, the active layer, and the upper mirror to ion implantation, or
wherein the current confining structure is formed by selective oxidation of a current confining layer provided among the lower mirror, the active layer, and the upper mirror.

5. The surface emitting laser manufacturing method according to claim 4, further comprising a step of performing etching for forming the mesa structure using the first pattern in the resist pattern until at least a side surface of the current confining layer is exposed, between the performing of the first-phase etching and the performing of the second-phase etching.

6. The surface emitting laser manufacturing method according to claim 5, further comprising a step of forming a protective film that protects the surface relief structure, before the selective oxidation of the current confining layer to form the current confining structure.

7. The surface emitting laser manufacturing method according to claim 6, further comprising at step of removing the protective film, after the selective oxidation of the current confining layer to form the current confining structure and before the performing of the second-phase etching.

8. The surface emitting laser manufacturing method according to claim 7, wherein a buffered hydrofluoric acid is used for the removing of the protective film.

9. The surface emitting laser manufacturing method according to claim 1, further comprising a step of forming a part of an electrode for injecting current into the active layer, before the performing of the second-phase etching.

10. The surface emitting laser manufacturing method according to claim 1, further comprising a step of sealing a light emitting portion of the upper minor with a protective film, after the performing of the second-phase etching.

11. The surface emitting laser manufacturing method according to claim 1, wherein an etchant including a citric acid is used for the first-phase etching.

12. The surface emitting laser manufacturing method according to claim 1, wherein an etchant having an etching selectivity of the second relief layer no less than three times that of the first relief layer is used for the second-phase etching.

13. The surface emitting laser manufacturing method according to claim 1, wherein an etchant having an etching selectivity of the second relief layer no less than ten times that of the third relief layer is used for the second-phase etching.

14. The surface emitting laser manufacturing method according to claim 1, wherein an etchant including ammonia water is used for the second-phase etching.

15. The surface emitting laser array manufacturing method according to claim 1, further comprising a step of arranging a plurality of surface emitting lasers manufactured according to the steps of the method other than the arranging step.

* * * * *